(12) United States Patent
Spiegelman

(10) Patent No.: US 12,057,320 B2
(45) Date of Patent: Aug. 6, 2024

(54) HYDROGEN PEROXIDE PLASMA ETCH OF ASHABLE HARD MASK

(71) Applicant: RASIRC, Inc., San Diego, CA (US)

(72) Inventor: Jeffrey J. Spiegelman, San Diego, CA (US)

(73) Assignee: RASIRO, Inc., San Diego, CA (US)

( * ) Notice: Subject to any disclaimer, the term of this patent is extended or adjusted under 35 U.S.C. 154(b) by 0 days.

(21) Appl. No.: 18/472,551

(22) Filed: Sep. 22, 2023

(65) Prior Publication Data

US 2024/0112921 A1 Apr. 4, 2024

Related U.S. Application Data

(60) Provisional application No. 63/378,220, filed on Oct. 3, 2022.

(51) Int. Cl.
| | | |
|---|---|---|
| *H01L 21/311* | (2006.01) | |
| *H01J 37/32* | (2006.01) | |
| *H01L 21/3065* | (2006.01) | |
| *H01L 21/66* | (2006.01) | |

(52) U.S. Cl.
CPC .. *H01L 21/31116* (2013.01); *H01J 37/32522* (2013.01); *H01J 37/32972* (2013.01); *H01L 22/26* (2013.01); *H01J 37/32082* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 8,282,708 B2 | 10/2012 | Spiegelman et al. | |
| 9,410,191 B2 | 8/2016 | Alvarez et al. | |
| 9,545,585 B2 | 1/2017 | Alvarez et al. | |
| 9,610,550 B2 | 4/2017 | Alvarez et al. | |
| 10,363,497 B2 | 7/2019 | Spiegelman et al. | |
| 11,634,816 B2 | 4/2023 | Blethen et al. | |
| 2003/0219988 A1 | 11/2003 | Shan et al. | |
| 2004/0043620 A1* | 3/2004 | Ying ................. | H01L 21/02071 257/E21.256 |
| 2011/0306207 A1* | 12/2011 | Raghavan ........... | H01L 21/0206 438/669 |

(Continued)

FOREIGN PATENT DOCUMENTS

| | | |
|---|---|---|
| KR | 20140079334 A | 6/2014 |
| WO | 2013148262 A1 | 10/2013 |

(Continued)

OTHER PUBLICATIONS

International Search Report and Written Opinion dated Dec. 28, 2023 for PCT Patent Application No. PCT/IB2023/059410.

*Primary Examiner* — Shamim Ahmed
(74) *Attorney, Agent, or Firm* — MLO, a professional corp.

(57) ABSTRACT

The techniques described herein relate to a method for etching an ashable hard mask (AHM) on a substrate. The method includes forming a plasma from a gas mixture, wherein the gas mixture includes hydrogen peroxide vapor with a concentration greater than 0.1% by volume, wherein the concentration of the hydrogen peroxide vapor in the gas mixture is substantially stable over time, and wherein the plasma comprises hydrogen peroxide species. The method further includes etching the AHM by exposing the AHM to the plasma.

20 Claims, 24 Drawing Sheets

(56) References Cited

U.S. PATENT DOCUMENTS

| | | |
|---|---|---|
| 2012/0285492 A1 | 11/2012 | Lee et al. |
| 2015/0357202 A1 | 12/2015 | Thedjoisworo et al. |
| 2017/0263436 A1 | 9/2017 | Brown et al. |
| 2017/0365450 A1 | 12/2017 | Bi et al. |
| 2020/0194277 A1 | 6/2020 | Dai et al. |
| 2020/0291517 A1 | 9/2020 | Blethen et al. |
| 2020/0393086 A1 | 12/2020 | Blethen et al. |
| 2022/0139717 A1 | 5/2022 | Sreenivasan et al. |

FOREIGN PATENT DOCUMENTS

| | | |
|---|---|---|
| WO | 2014014511 A1 | 1/2014 |
| WO | 2016164380 A1 | 10/2016 |
| WO | 2017027581 A1 | 2/2017 |

* cited by examiner

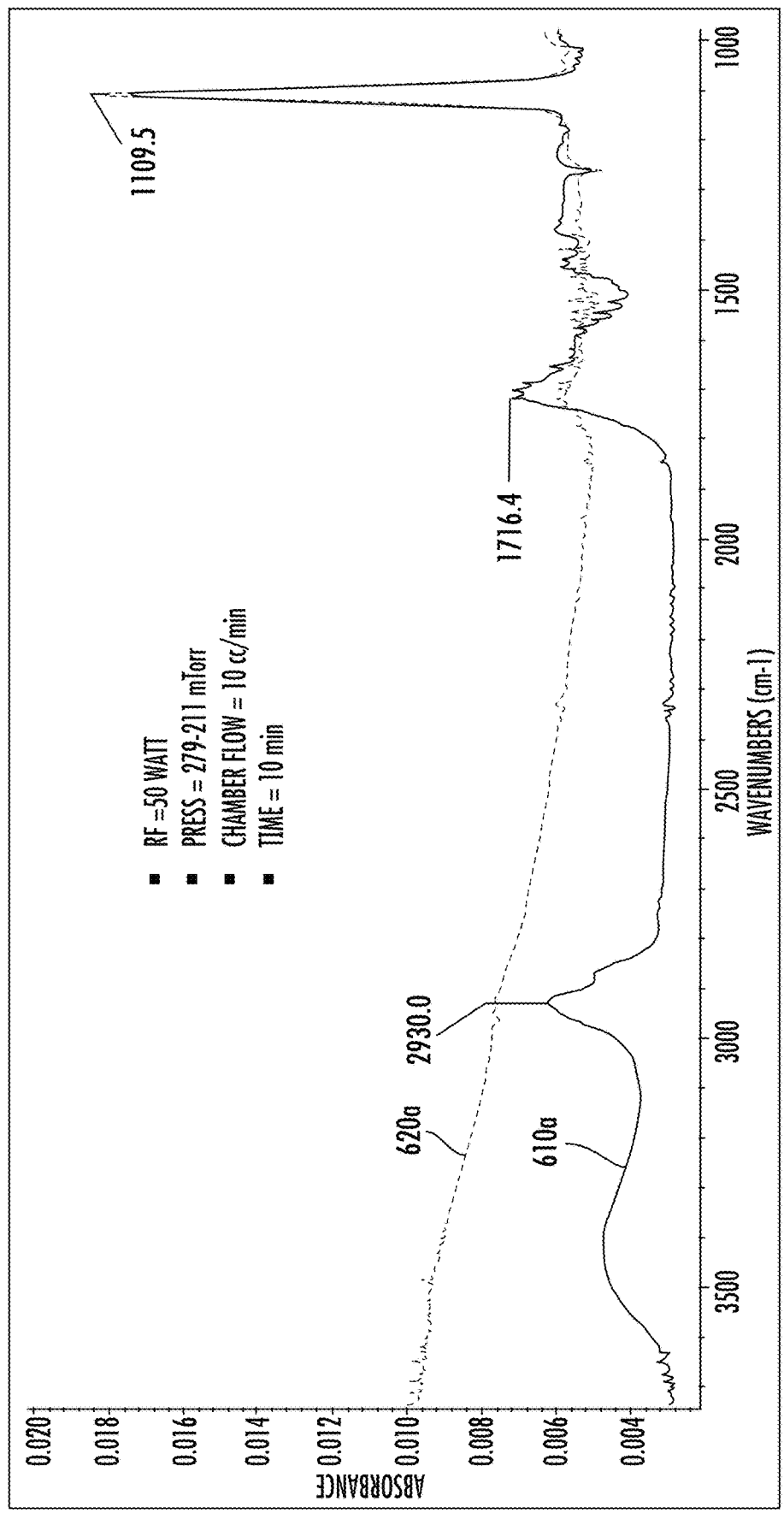

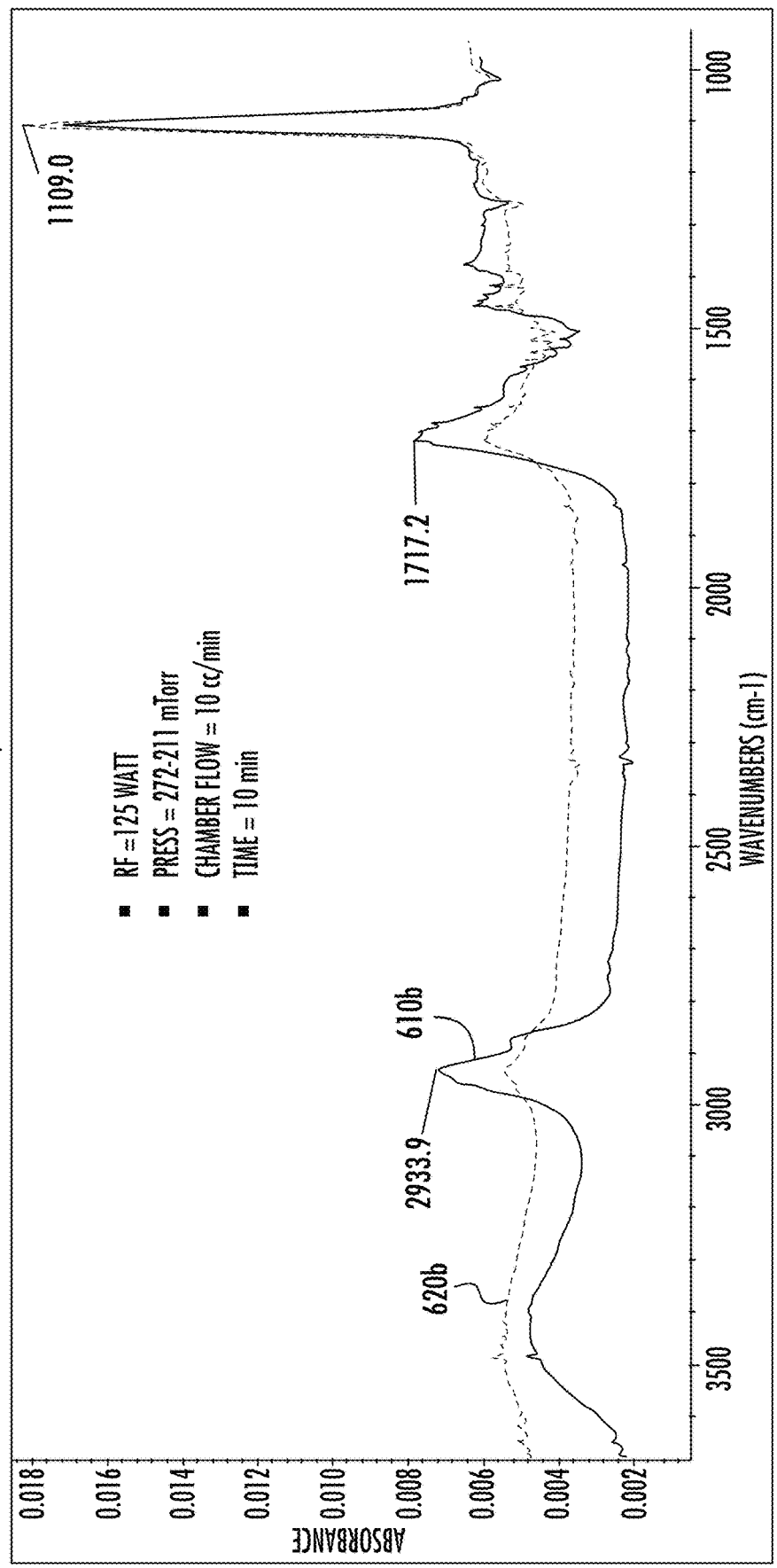

HYDROGEN PEROXIDE PLASMA ETCH OF ASHABLE HARD MASK

RELATED APPLICATIONS

This application claims the benefit of U.S. Provisional Patent Application No. 63/378,220, filed on Oct. 3, 2022, and entitled "Hydrogen Peroxide Plasma Etch of Ashable Hard Mask"; which is hereby incorporated by reference for all purposes.

BACKGROUND

Semiconductor manufacturing processes can include the deposition of an ashable hard mask (AHM), an amorphous carbon film that is commonly deposited using PECVD and CxHy precursors, such as methane and/or acetylene (CH4, C2H2). AHMs can be used on silicon wafers, for example, as a patterned mask and/or to protect underlying materials during subsequent processing. Conventionally, many silicon wafers with AHMs are discarded because of the difficulty of removing an AHM coating. For example, plasmas based on a mixture of O2 and CxFy gases have been required to remove AHMs, which produce fluorine radicals but also fluorinated byproducts that are considered greenhouse gases, and which are problematic and costly to scrub.

SUMMARY

In some embodiments, the techniques described herein relate to a method, including: forming a plasma from a gas mixture, wherein: the gas mixture includes hydrogen peroxide vapor with a concentration greater than 0.1% by volume; the concentration of the hydrogen peroxide vapor in the gas mixture is substantially stable over time; and the plasma includes hydrogen peroxide species; and etching an ashable hard mask (AHM) on a substrate by exposing the AHM to the plasma.

In some embodiments, the techniques described herein relate to a method, including: providing a substrate including an ashable hard mask (AHM) within a plasma chamber; providing a gas mixture to the plasma chamber including hydrogen peroxide vapor with a concentration greater than 0.1% by volume, wherein the concentration of the hydrogen peroxide vapor in the gas mixture is substantially stable over time; forming a plasma including hydrogen peroxide species in the plasma chamber; and etching the AHM by exposing the AHM to the plasma.

BRIEF DESCRIPTION OF THE DRAWINGS

FIGS. 4A-7B show FTIR results from hydrogen peroxide plasma etching tests, in accordance with some embodiments.

DETAILED DESCRIPTION

Figure 1:
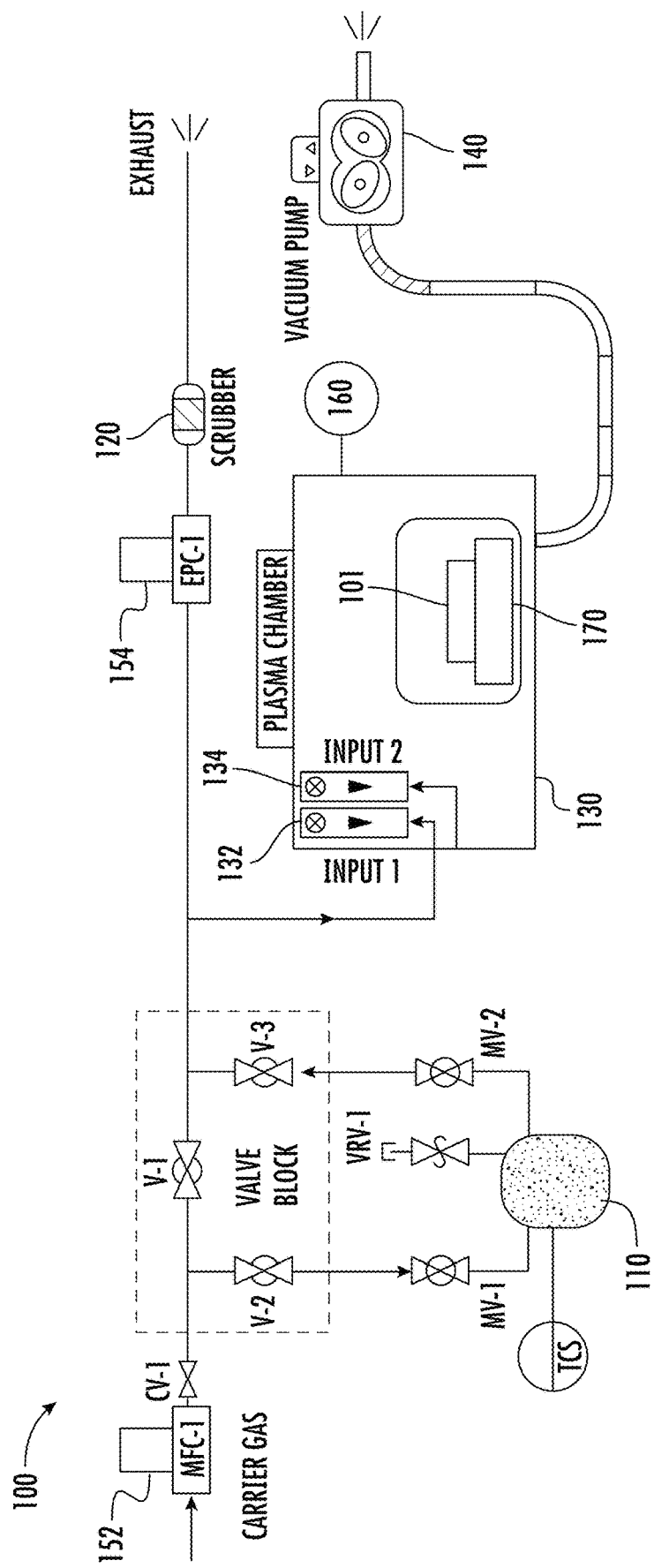
FIG. 1 is a schematic of a system that can be used to etch wafers with AHMs using a plasma containing hydrogen peroxide vapor, in accordance with some embodiments.

The present disclosure relates generally to hydrogen peroxide ($H_2O_2$) plasma etching of ashable hard masks (AHMs). Methods and systems for etching AHMs using a plasma comprising hydrogen peroxide species are described herein. The hydrogen peroxide can be delivered using a direct vacuum draw method, or using a carrier gas. The carrier gas can include one or more noble gases (such as Ar, Ne, Kr, or He), compressed dry air (CDA), $N_2$, hydrogen, or mixtures thereof. In some cases, it may be beneficial to use hydrogen, $N_2$, helium, or mixtures thereof to reduce damage to underlying materials while (and/or immediately after) etching the AHM.

AHMs are conventionally used during semiconductor processing as masks that are resistant to plasma etching. The present systems and methods advantageously enable the plasma etching (or removal) of an AHM from a substrate (e.g., silicon) using a hydrogen peroxide plasma (e.g., a plasma containing hydrogen peroxide species, and other species such as carrier gas species). In some cases, the hydrogen peroxide plasma does not contain halogen radicals (e.g., fluorine radicals) or halogenated byproducts (e.g., fluorinated byproducts), which can be advantageous because halogen species can be toxic and/or corrosive and costly. In some cases, the hydrogen peroxide plasma does not contain sulfur radicals or sulfur-containing byproducts, which can be advantageous because sulfur species can be toxic and/or corrosive.

In some cases, a gas mixture used to form the hydrogen peroxide plasma does not contain oxygen (or contains less than 1% oxygen, or less than 0.1% oxygen, or less than 0.01% oxygen). Oxygen plasmas can also be used to remove AHMs, as described further herein, however, oxygen plasmas were found to be more aggressive than the hydrogen peroxide plasmas used for AHM removal herein. The aggressiveness of the oxygen plasmas could lead to increased oxidization of underlying and/or adjacent layers and/or structures compared to AHM removal using the hydrogen peroxide plasmas described herein.

The systems and methods for hydrogen peroxide plasma etching of AHMs described herein can include a hydrogen peroxide source capable of delivering controlled quantities of hydrogen peroxide vapor to a plasma chamber.

The hydrogen peroxide plasma can be used to remove an AHM, or to react with the AHM to make it more easily removed by wet etch processes. In some cases, after a hydrogen peroxide plasma etch process, the AHM can be etched using a wet etch (e.g., using HF, sulfuric acid, liquid $H_2O_2$, or combinations thereof). The hydrogen peroxide plasma can be used to etch or remove an AHM from a substrate (e.g., a semiconductor wafer), or from components in the tool that have AHM coatings deposited thereupon, such as susceptors, wafer holders, shrouds, and/or shields.

When a carrier gas is used, it can be many different species such as noble gases (e.g., argon, helium, etc.), nitrogen, CDA, or hydrogen. However, some species, such as argon, in the plasma have the potential to damage the silicon substrate and render the etched wafer surface unusable, so in some cases an alternative carrier gas that is less damaging to the substrate can be used, such as CDA, $N_2$, helium, or mixtures thereof. In some cases, hydrogen gas can be used as the carrier gas for the hydrogen peroxide plasma, which can form $H^+$ species to reduce the sample while the AHM is being etched by the hydrogen peroxide plasma. In some cases, the substrate or a film on the substrate (e.g., a metal, insulator or semiconductor film) can be oxidized (or partially oxidized) due to the AHM being etched by the hydrogen peroxide plasma, and then the substrate or film can be reduced (or partially reduced) after the etching is complete (e.g., using a hydrogen treatment process), resulting in a substrate or film that can be subsequently processed. In some cases, the substrate or film can be affected the AHM being etched by the hydrogen peroxide plasma, but not adversely affected (e.g., such that the substrate and/or film can be subsequently processed).

FIG. 1 is a schematic of a system 100 that can be used to etch a sample 101 (e.g., semiconductor wafer(s), such as silicon wafer(s), or semiconducting substrates, insulating substrates, or conductive substrates) with AHMs using a plasma containing hydrogen peroxide species. A carrier gas (e.g., Ar, $N_2$, CDA, helium, or mixtures thereof) is provided and controlled using mass flow controller (MFC) 152. The carrier gas can be directed through the hydrogen peroxide vaporizer vessel 110 to send hydrogen peroxide vapor through the process line, which can be held at a pressure from 20 Torr to 2500 Torr, for example, 812 Torr (1 atm), by back-pressure regulator 154 in back-pressure mode. In such cases, the concentration of hydrogen peroxide compared to the carrier gas will be affected by the pressure in the process line, and the concentration of hydrogen peroxide can be controlled using the process line pressure, in some cases. Before being output through an exhaust, the hydrogen peroxide vapor is decomposed by scrubber 120 (e.g., a metal oxide-filled scrubber). In other embodiments, no carrier gas is used, and direct vacuum is used to draw the hydrogen peroxide vapor from the hydrogen peroxide vaporizer vessel 110 to the plasma chamber 130. The pressure and the amount of hydrogen peroxide delivered from the hydrogen peroxide vaporizer vessel 110 can both affect the concentration of hydrogen peroxide in the gas mixture provided to the plasma chamber 130.

Additionally, valves V-1, V-2, V-3, MV-1 and MV-2 allow system 100 to direct carrier gas through hydrogen peroxide vaporizer vessel 110, in order to deliver hydrogen peroxide vapor from the hydrogen peroxide vaporizer vessel 110 to plasma chamber 130. Valve VRV-1 is a vent relief valve, for example, in case of over pressure within hydrogen peroxide vaporizer vessel 110, or in case of $H_2O_2$ rapid decomposition. In some cases, valves V-1, V-2, V-3, MV-1 and MV-2 can be diaphragm valves, which have few moving parts, or other valves that are suitable for high purity gases and not reactive to hydrogen peroxide vapor. The valves are also arranged in system 100 to enable the process line to be purged with the carrier gas by opening bypass valve V-1 and closing V-2 and V-3. Check valve CV-1 prevents backflow from the process into the carrier gas source. Vacuum pump 140 is coupled to plasma chamber 130. Vacuum pump 140 can be capable of, for example, reaching 15 mTorr ultimate vacuum pressure in the chamber and displacement of 3.6 $ft^3$/min of gas.

The power input for the plasma formed in plasma chamber 130 can depend on the size and geometry of plasma chamber 130 and/or other factors. The power input for the plasma can be from 5 watts to 125 watts, from 1 watt to 1000 watts, from 1 watt to 100,000 watts, or can be greater than 100,000 watts. The frequency of the plasma can be 13.56 MHz, or can be other frequencies in different embodiments.

From the process line, a portion of gas can be introduced into the plasma chamber 130 at input 132 (Input 1), which is a valve (e.g., a rotameter valve, or needle valve) that restricts the flow into the plasma chamber 130 and directs the balance of flow through back-pressure regulator 154 to the scrubber 120. A second input 134 (Input 2) is another valve that can be used to introduce a second gas (e.g., Ar gas for purging the system, a reactive gas, or a gas that is not compatible with hydrogen peroxide) into plasma chamber 130. The vacuum pump 140 can be run continuously to form a vacuum in the plasma chamber 130 and to limit deposition of etch byproducts. The pressure in plasma chamber 130 can be controlled before and during etch process by: (1) a vacuum setting, which determines vacuum level when the reactive gas delivery valves opens; (2) a flow rate setting on the input 132 valve (e.g., a rotameter valve); and/or (3) a throttling valve (not shown) between vacuum pump 140 and plasma chamber 130. For example, when the input 132 valve is open, then the lines upstream from plasma chamber 130 will be under vacuum (from vacuum pump 140) and carrier gas with hydrogen peroxide from hydrogen peroxide vaporizer vessel 110 will flow into plasma chamber 130. The process line is held at a set value of high pressure (e.g., 20 Torr to 2500 Torr, or 812 Torr) and back-pressure regulator 154 prevents the pressure in the process line from exceeding a set value (e.g., 812 Torr).

The plasma chamber 130 pressure can be affected by the vacuum pump 140. The pressure can impact ion density, which can influence etch uniformity. Therefore, pressure control can be used to control the etch process, such as whether the etch is an isotropic etch or an anisotropic etch. Pressure control can be done using feedback from a sensor 160 (e.g., pressure gauge), for example, coupled to the plasma chamber 130. In such cases, a control system can be coupled to components of the system (e.g., valves to direct flow, a mass flow controller (MFC) to control flow rate, a hydrogen peroxide vessel heater to control temperature, throttle valve to restrict the pumping speed of the vacuum pump, etc.) and sensors (e.g., pressure gauge(s), thermocouples, etc.). The control system can include a processor and tangible, computer-readable media (e.g., a local memory storage device, or on a server in the cloud) configured to communicate with and control the components and sensors of the system. The control system can control the component(s) based on feedback from the sensor(s). A plasma can be directly generated in plasma chamber 130 (with the wafer or sample to be processed), or the plasma can be remotely generated and coupled into plasma chamber 130. The sample containing the AHM to be etched (e.g., a semiconductor wafer with a AHM coating) can either be charged or neutral during the plasma etching of the AHM.

In system 100 shown in FIG. 1, hydrogen peroxide vapor composition and concentration can be controlled in the process line (held at constant pressure, e.g., 812 torr, or from 20 Torr to 2500 Torr) using the MFC 152, the back-pressure regulator 154, input 132 flow settings, and the valves in system 100. Meanwhile, the moles of reactive gas molecules present at any time in the plasma chamber 130 are dependent on the gas flow rate through the plasma chamber 130, pressure in the chamber, and the amount of reactive gas in the process gas mixture entering the chamber. The gas concentration in the plasma chamber 130 is dependent on flow and the displacement of the vacuum pump 140. In some cases, during use, the pressure will not be able to be held steady but will decrease gradually, e.g., during the duration of an etching run.

In some cases, system 100 in FIG. 1 can further include a temperature control system 170 which can heat or cool sample 101, for example to maintain constant temperatures in the chamber during processing and/or to increase the temperature of sample 101 to increase the etch rate.

The power of the plasma, the pressure in plasma chamber 130, the flow rate of gas into plasma chamber 130, and the concentration of hydrogen peroxide (and/or other components) in the plasma in plasma chamber 130, and the temperature of the sample (e.g., a semiconductor wafer with an AHM coating) being etched, can vary in different embodiments. For example, higher plasma power can increase the etching rate, but can also cause more damage (e.g., oxidation or etching) to underlying films/materials (e.g., a semiconductor substrate). Higher hydrogen peroxide species concentrations in the plasma can also increase the etching rate, however, higher hydrogen peroxide species concentrations in the plasma can also lead to damage (e.g., increased oxidation) of the substrate or redeposition of etched species (e.g., back onto the sample being etched, or onto other components of the system, such as susceptors, wafer holders, shrouds, and/or shields). Higher flow rate of gas into plasma chamber 130 can reduce the amount of redeposition of etched species, can increase the rate that reactive species reach the chamber to replace consumed reactants, and also help remove any contaminants present in plasma chamber 130. Higher temperature of the sample being etched can also increase the etching rate. For example, the temperature of the AHM and/or the substrate can be from 25° C. to 450° C., from 50° C. to 450° C., from 50° C. to 300° C., or from 150° C. to 300° C. The substrate temperature can be actively controlled (heated or cooled) during the etching, or it can be uncontrolled (e.g., it can heat up during the etching due to the exposure to the plasma).

The power of the plasma, the pressure in plasma chamber 130, the flow rate of gas into plasma chamber 130, and the concentration of hydrogen peroxide (and/or other components) in the plasma in plasma chamber 130 can also interact with one another. For example, the pressure in plasma chamber 130, the flow rate of gas into plasma chamber 130, and the concentration of hydrogen peroxide (and/or other components) in the plasma in plasma chamber 130 can all determine if the etch reactions are surface reaction limited. In cases where the conditions cause the etch reactions to be surface reaction limited, increasing the concentration of hydrogen peroxide in the plasma can increase etch rate. In another example, the pressure in plasma chamber 130 and the temperature of the sample being etched can affect the evaporation rate of the AHM and therefore the etch rate.

In some cases, during etching, plasma chamber 130 can have a pressure from about 200 mTorr to 600 mTorr, or from about 200 mTorr to about 300 mTorr, from 200 mTorr to 1 Torr, from 10 mTorr to 10 Torr, or from $10^{-4}$ Torr to 1 atm. The flow rate of gas into plasma chamber 130 (or the flow rate of a carrier gas through hydrogen peroxide vaporizer 110) can be from 10 sccm to 200 Lpm, or from 10 sccm to 10 Lpm, or from 10 sccm to 1 Lpm. The concentration of hydrogen peroxide vapor in the gas input into plasma chamber 130 during etching can be from 0.1% to 99.9%, from 0.1% to 90%, from 0.1% to 50%, from 1% to 50%, from 10% to 50%, from 0.1% to 40%, from 1% to 40%, from 10% to 40%, or greater than 0.1% by volume, or greater than 1% by volume, or greater than 2.5% by volume, or greater than 10% by volume, or from 0.1% to 10% by volume, or from 0.1% to 2.5% by volume, or from 1% to 10% by volume, or from 1% to 2.5% by volume, or from 2.5% to 10% by volume, or from 1% to greater than 10% by volume. The process time, or the duration of the etching, or the exposure time (of the AHM to the plasma) can be from 1 min to 10 min, or from 10 sec to 100 min.

The gas mixture that is delivered from the hydrogen peroxide vaporizer vessel 110 to the plasma chamber 130 can have a hydrogen peroxide concentration from 500 parts per million by volume (ppmv) to 4000 ppmv, or from 100 ppmv to 100,000 ppmv, or greater than 0.1% by volume, or greater than 1% by volume, or greater than 2.5% by volume, or greater than 10% by volume, or from 0.1% to 10% by volume, or from 0.1% to 2.5% by volume, or from 1% to 10% by volume, or from 1% to 2.5% by volume, or from 2.5% to 10% by volume, or from 1% to greater than 10% by volume.

Additionally, the gas mixture that is delivered to the plasma chamber 130 can contain water vapor with a concentration from 500 ppmv to 4000 ppmv, or from 100 ppmv to 400,000 ppmv, or less than 1% by weight, or less than 10% by weight. The gas mixture can contain a molar ratio of hydrogen peroxide vapor to water of about 1/3 or about 1/4, in some configurations. In other cases, the molar ratio of hydrogen peroxide vapor to water can be greater than 2, or greater than 1, or greater than 0.9, or greater than 0.8, or greater than 0.5, or from about 1 to 2.5, or from about 1 to 5.

The hydrogen peroxide vaporizer vessel 110 can be filled with high-quality hydrogen peroxide, for delivery to plasma chamber 130. In some cases, the hydrogen peroxide has water mixed with the hydrogen peroxide. In some cases, the hydrogen peroxide in hydrogen peroxide vaporizer vessel 110 is anhydrous or substantially anhydrous. In practice, it is difficult to remove all of the water from hydrogen peroxide, and in some cases, substantially anhydrous hydrogen peroxide contains less than 10%, less than 1%, less than 0.1%, less than 0.01%, or less than 0.001% water by weight. In some cases, hydrogen peroxide vaporizer vessel 110 can be filled with a mixed gas, which can contain hydrogen peroxide and other species, such as water. In some cases, the hydrogen peroxide in hydrogen peroxide vaporizer vessel 110 is mixed with water, wherein the amount of water in the mixture (or mixed gas) is less than 10% by weight, less than 2% by weight, less than 0.5% by weight, less than 1000 ppm, less than 100 ppm, less than 10 ppm, or from 10 ppm to 99% by weight, or from 100 ppm to 75% by weight, or from 100 ppm to 35% by weight, or from 10 ppm to 1% by weight, or from 1% to 99% by weight, or from 30% to 99% by weight, or from 30% to 75% by weight. Plasma etching an AHM using a hydrogen peroxide plasma that has a low water content can be advantageous since water can form $H^+$ in the plasma, which can undesirably reduce underlying layers or adjacent structures of sample 101 in certain cases. In other cases, when different types of substrates or underlying layers are present on the substrate with the AHM, then adding water can be beneficial in the etching rate and efficiency of the AHM. In some cases, the gas mixture from the hydrogen peroxide vaporizer vessel 110 has no intentionally introduced sulfur or halogen-containing species. In some cases, the gas mixture has a concentration of sulfur species less than 0.1% by volume, or less than 0.01% by volume. In some cases, the gas mixture has a concentration of halogen-containing species less than 0.1% by volume, or less than 0.01% by volume.

The ability to deliver a controlled and consistent concentration of hydrogen peroxide vapor to form the hydrogen peroxide plasma is difficult. Additionally, it is difficult to inject a liquid into a plasma chamber (e.g., in the form of a mist or droplets) to generate a plasma. Systems and methods to deliver hydrogen peroxide, particularly those capable of delivering a controlled and consistent concentration of hydrogen peroxide vapor to form the hydrogen peroxide plasmas described herein, are further described in U.S. Pat. Nos. 8,282,708, 9,410,191, 9,545,585, 9,610,550, 10,363,497, and 11,634,816; U.S. Pat. Pub. Nos. US20200291517A1, and US20200393086A1; and International Pub. Nos. WO2016/164380 and WO2017/027581, each of which is incorporated herein by reference in their entireties. Such systems and methods to deliver hydrogen peroxide can be used in the systems and methods described herein, for example, in hydrogen peroxide vaporizer vessel 110 in FIG. 1. Some examples of systems and methods to deliver hydrogen peroxide are described herein.

In some embodiments, the systems and methods described herein include hydrogen peroxide sources configured to provide and maintain a concentration of hydrogen peroxide vapor in the gas mixture that is substantially stable over time (or is maintained at a substantially constant value or relatively constant value over time). The concentration (or volume fraction) of the hydrogen peroxide vapor in the gas mixture can be substantially stable, for example, if the concentration is maintained to within 5%, or within 3%, or within 1% of the mean over an hour of gas mixture delivery. The concentration (or volume) of the hydrogen peroxide vapor in the gas mixture can be substantially stable, for example, if the concentration has a standard deviation of up to 5%, or up to 3%, or up to 1% over an hour.

For example, the hydrogen peroxide vaporizer vessel 110 in FIG. 1 can be configured to provide a substantially stable (or substantially constant) concentration of hydrogen peroxide vapor in the gas mixture over time (e.g., for about an hour), either through the use of a carrier gas or by using a vacuum to directly draw the hydrogen peroxide vapor from the hydrogen peroxide vaporizer vessel 110. In some cases, the hydrogen peroxide vapor concentration in the gas mixture is substantially stable over time with a hydrogen peroxide concentration from 500 parts per million by volume (ppmv) to 4000 ppmv, or from 100 ppmv to 100,000 ppmv, or greater than 0.1% by volume, or greater than 1% by volume, or greater than 2.5% by volume, or greater than 10% by volume, or from 0.1% to 10% by volume, or from 0.1% to 2.5% by volume, or from 1% to 10% by volume, or from 1% to 2.5% by volume, or from 2.5% to 10% by volume, or from 1% to greater than 10% by volume.

The hydrogen peroxide source (e.g., hydrogen peroxide vaporizer vessel 110 in FIG. 1) used to deliver hydrogen peroxide vapor to the plasma chamber (or other system component, e.g., a storage vessel) in the systems and methods described herein can utilize a carrier gas to deliver the hydrogen peroxide vapor from the source to the plasma chamber, or can use vacuum to directly draw the hydrogen peroxide vapor from the hydrogen peroxide source. In some embodiments, the hydrogen peroxide source can include a pre-loaded carrier gas in fluid contact with the vapor phase of a multi-component liquid source (e.g., aqueous hydrogen peroxide), and/or a non-aqueous (or anhydrous) hydrogen peroxide solution having a vapor phase separated from the hydrogen peroxide solution by a membrane.

The hydrogen peroxide sources described herein are uniquely capable of providing controlled concentrations of hydrogen peroxide vapor that are substantially stable over time. According to Raoult's Law, when the vapor phase of a liquid solution is continuously swept away by a carrier gas, the more volatile component will evaporate more quickly than the less volatile component, resulting in a dynamic (or changing) concentration of the components in the liquid solution, and likewise, a dynamic (or changing) concentration of the components in a vapor produced from the liquid solution. If evaporation of the more volatile component continues, the solution will become more concentrated for the less volatile component, and in some cases (e.g., aqueous hydrogen peroxide solutions), this may take a stable solution and convert it to a highly concentrated hazardous material. The hydrogen peroxide sources of the systems and methods described herein overcome such limitations and are configured to deliver stable concentrations of a vapor of hydrogen peroxide over time, for example, by using a pre-loaded carrier gas in fluid contact with the vapor phase of a multi-component liquid source, and/or using a non-aqueous (or anhydrous) hydrogen peroxide solution having a vapor phase separated from the hydrogen peroxide solution by a membrane.

In some embodiments, the hydrogen peroxide source of the systems and methods described herein can include: (a) a multi-component liquid source (e.g., containing aqueous hydrogen peroxide, or a solution containing hydrogen peroxide and a solvent) having a vapor phase optionally separated from the liquid source by a membrane; (b) a pre-loaded carrier gas source that is in fluid contact with the vapor phase, wherein the pre-loaded carrier gas comprises a carrier gas and at least one component of the liquid source; and (c) an apparatus for delivering a gas stream comprising at least one component of the liquid source. The membrane can be one that is permeable to hydrogen peroxide, particularly a substantially gas-impermeable membrane, e.g., a perfluorinated ion-exchange membrane, such as a NAFION® membrane. In some embodiments, the apparatus for delivering a process gas containing gas stream is an outlet of a head space, which contains the vapor phase, connected directly or indirectly to a plasma chamber, allowing the process gas containing gas stream to flow from the head space to the plasma chamber. Methods for delivering the hydrogen peroxide from such a source can include adjusting the operating conditions, for example, the temperature and pressure of the pre-loaded carrier gas, flow rate of the carrier gas, the concentration of the liquid source, and the temperature and pressure of the liquid source, the hydrogen peroxide can be precisely and safely delivered as a process gas.

In some embodiments, the hydrogen peroxide source of the systems and methods described herein can include: (a) an aqueous hydrogen peroxide source and a gas phase provided by the aqueous hydrogen peroxide source, wherein the aqueous hydrogen peroxide source comprises hydrogen peroxide at an initial concentration, and wherein the gas phase comprises hydrogen peroxide and water; (b) a carrier gas in fluid contact with the gas phase, whereby a hydrogen peroxide gas stream is formed, and whereby formation of the hydrogen peroxide gas stream the concentration of hydrogen peroxide in the aqueous hydrogen peroxide source increases to a second concentration that is higher than the initial concentration; (c) a fill tube that replenishes the aqueous hydrogen peroxide source using an aqueous hydrogen peroxide solution comprising hydrogen peroxide at a third concentration that is lower than the second concentration; and (d) an apparatus that delivers the hydrogen peroxide gas stream to the material that is to be modified, wherein the delivered hydrogen peroxide gas stream comprises hydrogen peroxide at a substantially stable steady-state concentration. For example, maintaining a hydrogen peroxide vapor concentration in the gas mixture with a standard deviation of to within 3% or up to 5% of the mean for an hour would be considered substantially stable (or relatively constant).

In some embodiments, the hydrogen peroxide source of the systems and methods described herein can include: (a) a non-aqueous (or anhydrous) hydrogen peroxide solution having a vapor phase separated from the hydrogen peroxide solution by a membrane; (b) a carrier gas or vacuum in fluid contact with the vapor phase; and (c) an apparatus for delivering a gas stream comprising hydrogen peroxide from the source to the plasma chamber (or other system component, e.g., a storage vessel). The membrane can be, for example, a perfluorinated ion-exchange membrane, such as a NAFION® membrane. In some embodiments, the apparatus for delivering a gas stream comprising hydrogen peroxide is an outlet of a head space, containing the vapor phase, that is connected directly or indirectly to the plasma chamber, allowing the hydrogen peroxide containing gas stream to flow from the head space to the plasma chamber. By adjusting the operating conditions of the systems and devices, for example, the temperature and pressure of the carrier gas or vacuum, the concentration of the hydrogen peroxide solution, and the temperature and pressure of the hydrogen peroxide solution, hydrogen peroxide vapor can be precisely and safely delivered in the gas mixture. In some embodiments, the amount of hydrogen peroxide in the vapor phase and delivered to the plasma chamber can be controlled by adding energy to the hydrogen peroxide solution, e.g., thermal energy, rotational energy, or ultrasonic energy. In some cases, methods for operating such a hydrogen peroxide source can include: (a) providing a non-aqueous hydrogen peroxide solution having a vapor phase separated from the hydrogen peroxide solution by a membrane; (b) contacting a carrier gas or vacuum with the vapor phase; and (c) delivering a gas stream comprising substantially anhydrous hydrogen peroxide to the plasma chamber.

The multi-component liquid solutions and/or the non-aqueous hydrogen peroxide solutions of the sources described above can be, for example, non-aqueous solutions are solutions containing alcohols, polyalcohols, phenols, lactones, amides, esters, polyesters, ethers, carboxylic acids, polycarboxylic acids, sulfonic acids, sulfinic acids, phosphonic acids, phosphinic acids, organic solvents, inorganic solvents, aromatic compounds, polyaromatic compounds, heterocyclic compounds, including polyheterocyclic compounds, fluorinated ethers, fluorinated alcohols, fluorinated sulfonic acids, fluorinated carboxylic acids, polycarboxylic acids, fluorinated phosphonic acids, deep eutectic solvents, such as those disclosed in U.S. Pat. No. 3,557,009 and herein incorporated by reference, and combinations thereof that do not contain substantial amounts of water. Examples of solvents for such multi-component liquid solutions and/or non-aqueous hydrogen peroxide solutions include diethyl phthalate, propylene carbonate, triethylphosphate, polyvinylpyrroidone, polyvinylalcohol, polyvinylacetate-polyvinylpyrrolidone co-polymer, mellitic acid, benzenehexol, tetrahydobenzoquinone, 1,8-octanediol, 2,6-dichlorophenol, acridine, 8-hydroxyquinoline, benzylic acid, 1,4-dioxane, amyl acetate, DMF, DMSO, dimethylacetamide, 2-ethyl-1-hexanol, furfuryl alcohol, 2-octanol, 2-methyl-2-heptanol, and combinations thereof.

In some embodiments, the hydrogen peroxide source of the systems and methods described herein can include a storage device for a process solution containing hydrogen peroxide. The storage device can include: a housing with a wick material disposed therein; a process solution contained within the housing and in fluid contact with the wick material such that the solution is adsorbed onto the wick material, thereby diluting the solution within the wick material; and a head space contained within the housing and separated from the process solution by the wick material. The process solution contains hydrogen peroxide, and optionally one or more other components (e.g., water, solvent, or any of the liquids described herein). In some cases, the process solution contains anhydrous hydrogen peroxide. In various embodiments, the housing is configured to allow a carrier gas to flow through the head space or is configured to allow a vacuum to be drawn through the head space to produce a gas stream comprising a gas phase of the process solution to deliver the gas stream to plasma chamber (or other system component, e.g., a storage vessel). In some embodiments, the quantity of the process solution in the device is about 30% to 1900% by weight of the process solution/wick material complex, or is about 30% to 800% by weight of the process solution/wick material complex, or is about 30 to 100 weight percent of the process solution/wick material complex.

In some embodiments, the wick material of the devices described above is a porous structure with a surface area ranging from 100 to 1000 $m^2/g$. In various embodiments, the wick material is configured to adsorb over 42% by mass (or "w/w") hydrogen peroxide, or to absorb over 50% w/w hydrogen peroxide, or over 100% w/w, or over 200% w/w, or over 800% w/w, or over 1000% w/w, or over 1900% w/w hydrogen peroxide. In some embodiments, the concentration of the hydrogen peroxide solution is below 30% w/w. In some embodiments, the concentration of the hydrogen peroxide solution is stable over time, such as over a period of time that is no less than approximately 1 hour, or no less than 100 hours. In some embodiments, the concentration of the hydrogen peroxide vapor output from the device is stable over time, for example, approximately 1 hour.

In some embodiments, the wick material is formed as a fabric, a powder, one or more bricks, one or more blocks, one or more beads, one or more particles, one or more extrudates, or one or more pellets. In some embodiments, the wick material is a non-woven fabric that has been treated with a mechanical finishing process, such as spun bonding, needle bonding, perforation bonding, carding, and any combination thereof. In some embodiments, the non-woven fabric is a polytetrafluoroethylene (PTFE) fabric. In some embodiments, the wick material is formed as a mesh. In some embodiments, the wick material is formed from a material such as alumina, aluminum oxide, titanium dioxide, silica, silicon dioxide, quartz, activated carbon, carbon molecular sieve, carbon pyrolyzate, polytetrafluoroethylene (PTFE), polyester (PE), polyethylene terephthalate (PET), polyethylene/polyethylene terephthalate co-polymer, polypropylene (PP), rayon, zirconium oxide, zeolite, high silica zeolite, polymethylpentene (PMP), polybutylene terephthalate (PBT), polyethylene/polypropylene co-polymers, Hydrophilic High Density Polyethylene (HDPE), Hydrophobic High Density Polyethylene (HDPE), Hydrophilic UHMW Polyethylene, Hydrophobic UHMW Polyethlyene, perfluoroalkoxy alkane (PFA), polyvinylidene fluoride (PVF), silk, tencel, sponge materials, polyethylene glycol (PEG), polyvinyl alcohol (PVA), and/or polyvinylpyrrolidone (PVP), polypyridine, polyacrylates, polyacrylic acid, polyacrylic acid/acrylate co-polymers, polycarbonates, polyacrylamides, polyacrylate/acrylamide co-polymers, cellulosic materials, and any combination thereof. In some embodiments, the mesh substrate is spiral-wound within the housing.

In some embodiments, the above storage device includes a separator disposed adjacent to the mesh, wherein the separator is configured to support and separate layers of the spiral-wound mesh. In certain embodiments, the separator is formed from PTFE.

In some embodiments, the wick material is a hydrogel selected from the group consisting of polyethylene glycol (PEG), polyvinyl alcohol (PVA), polyvinylpyrrolidone (PVP), polypyridine, and any combination thereof. In various embodiments, the hydrogel is a 20% PEG hydrogel or a 40% PEG hydrogel. In some embodiments, the hydrogel is wrapped in a PTFE mesh and/or may further include a separator disposed adjacent to the mesh.

In some embodiments, a method for delivering the hydrogen peroxide vapor using the above hydrogen peroxide source includes contacting the process solution containing hydrogen peroxide with the wick material within the enclosed housing such that the solution is adsorbed onto the wick material, thereby diluting the process solution within the wick material; exposing the wick material to a carrier gas or a vacuum, thereby forming a gas stream comprising a gas phase of the process solution; and delivering the gas stream to a plasma chamber (or other component of the system). The housing may be configured to allow the carrier gas to flow through a head space contained within the housing or is configured to allow vacuum to be drawn through the head space, and the head space may be separated from the process solution by the wick material.

In some embodiments a hydrogen peroxide vapor delivery system includes the process solution provided within the housing, wherein the process solution is in contact with a wick material disposed within the housing such that the solution is adsorbed onto the wick material, thereby diluting the process solution within the wick material. The chemical delivery system may also include a carrier gas or vacuum in fluid contact with the gas phase in the head space of the process solution, thereby forming a transportable gas stream within the head space. The chemical delivery system may further include an apparatus in fluid communication with the housing and used for delivering the gas stream to a plasma chamber (or other component of the system). In some embodiments, the housing allows the carrier gas to flow through a head space contained within the housing or allows vacuum to be drawn through the head space.

The hydrogen peroxide source methods and systems described above, including the process solution and the wick material, may further comprise use of various components for containing and controlling the flow of the gases and liquids used therein. For example, the methods and systems may include one or more mass flow controllers, valves, check valves, filters, pressure gauges, gas sensors, regulators, rotameters, and pumps. The methods and systems provided herein may also include various heaters, thermocouples, and temperature controllers to control the temperature of various components of the systems and steps of the methods.

In some embodiments, the systems and methods described herein include hydrogen peroxide sources (such as those described above) configured to provide and maintain a molar ratio of water to hydrogen peroxide that is substantially stable over time (or is maintained at a substantially or relatively constant value over time). The molar ratio of water to hydrogen peroxide that is substantially stable over time in the gas mixture can be substantially stable, for example, if the molar ratio (or the concentration of the hydrogen peroxide and the concentration of the water) is maintained to within 1%, or within 3%, or within 5% of the mean for an hour of gas mixture delivery. The molar ratio of water to hydrogen peroxide that is substantially stable over time in the gas mixture can be substantially stable, for example, if the molar ratio has a standard deviation of 1%, or 3%, or up to 5% over an hour. For example, the hydrogen peroxide vaporizer vessel 110 in FIG. 1 can be configured to provide a substantially constant concentration of hydrogen peroxide vapor and water in the gas mixture, either through the use of a carrier gas or by using a vacuum to directly draw the hydrogen peroxide vapor from the hydrogen peroxide vaporizer vessel 110. The hydrogen peroxide vapor and water concentrations can be any of those described herein.

Sensor 160 coupled to the plasma chamber 130 can be one or more of a pressure gauge, vacuum gauge, optical sensor (e.g., a reflectometer), thin film endpoint detector, thermometer or thermocouple, and/or a residual gas analyzer. For example, sensor 160 can be a residual gas analyzer configured to measure the plasma species and/or etched species present in plasma chamber 130. In another example, sensor 160 can be a reflectometer configured to measure a reflection from a surface of sample 101 during etching. In such cases, sensor 160 can be used to detect when the AHM has been etched away, and when the plasma begins to etch the underlying substrate (e.g., Si).

In some cases, a sample 101 containing an AHM is placed on a susceptor inside plasma chamber 130 for processing. In some cases, a coating (e.g., an AHM or other film), or residue on the susceptor can be removed and/or cleaned using the hydrogen peroxide plasma. In some embodiments, the susceptor is cleaned and the AHM is etched using the hydrogen peroxide plasma simultaneously. In some embodiments, AHM films may be selectively removed while leaving oxide and metal films on the surface.

Example: AHM Etching Using Hydrogen Peroxide Plasma

In this example, two silicon wafers, each with an AHM, were etched using a plasma containing hydrogen peroxide vapor. This example shows that under certain conditions, a hydrogen peroxide plasma can be used to etch (remove, or substantially remove) an AHM, while under other conditions hydrogen peroxide does not substantially remove the AHM. System 100 in FIG. 1 was used to perform the etch tests of this example, and nitrogen ($N_2$) gas was used as the carrier gas to deliver hydrogen peroxide vapor from hydrogen peroxide vaporizer vessel 110 to plasma chamber 130. Five coupons (1"×1" square, approximately) were cut from each wafer to undergo FTIR analysis first, then contact angle analysis of deionized (DI) water droplets using a tensiometer. Of the five coupons, four were used for testing in a 2×2 experimental design in which the independent variables were RF power and chamber pressure, and the two levels were high and low, as shown in Table 1. The wafers were placed on a perforated aluminum sample tray and etched using the plasma containing hydrogen peroxide vapor. For these tests the etch time was held constant at 10 minutes.

TABLE 1

Experimental design (2 × 2) for plasma-etch tests

|  |  | Pressure | |
| --- | --- | --- | --- |
|  |  | High | Low |
| RF Power | High | High Pressure High Power | Low Pressure High Power |
|  | Low | High Pressure Low Power | Low Pressure Low Power |

Figure 2:
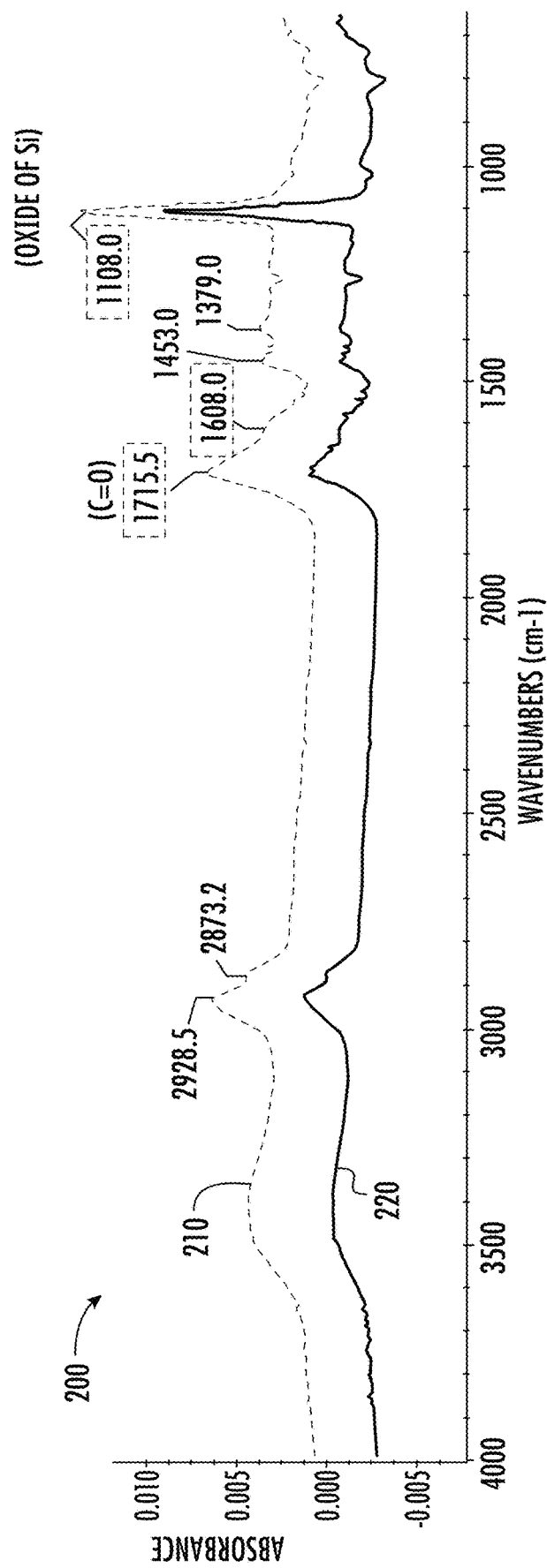
FIG. 2 shows Fourier transform infrared spectroscopy (FTIR) data from AHM films, in accordance with some embodiments.

FIG. 2 shows Fourier transform infrared spectroscopy (FTIR) data 200 from the AHM films on the two wafers in this example. Data 200 shows absorbance as a function of wavenumbers, where FTIR spectrum 210 was for a first wafer labeled 67ZSG2, and FTIR spectrum 220 was for a second wafer labeled 68ZSD1. FTIR spectra 210 and 220 of the AHM films from the two wafers in this example had some minor differences compared to FTIR spectra from some typical types of AHM films referenced in the technical literature (e.g., Antonelli et al., "Patterning with Amorphous Carbon Thin Films," ECS Transactions, 35 (4) pp. 701-716 (2011), The Electrochemical Society). The AHM films in this example had prominent peaks at about 1715 cm$^{-1}$, which is not an absorbance commonly referenced in the literature. This peak could be related to a C=O bond, and indicate that there is oxygen in the AHMs in this example. FTIR spectra 210 and 220 also showed peaks at about 1110 cm$^{-1}$, which could be related to an Si—O peak (e.g., at the Si substrate/AHM interface). The C=C peak (e.g., at about 1600 cm$^{-1}$) is relatively small, for example, compared to the C=O peak. The overall absorbances in FTIR spectra 210 and 220 had relatively low magnitudes, possibly indicating that the films in this example were thinner than AHMs deposited in the normal 200 nm to 500 nm range. FTIR spectra 210 from coupons from wafer 67ZSG2 showed somewhat larger peak sizes than FTIR spectra 220 from coupons from wafer 68ZSD1, possibly due to the AHM film on wafer 67ZSG2 being thicker. Moreover, the color of wafer 67ZSG2 was a lighter blue than seen on wafer 68ZSD1, but the spectral features were virtually identical, suggesting that AHM composition was the same despite the color difference.

Figure 3:
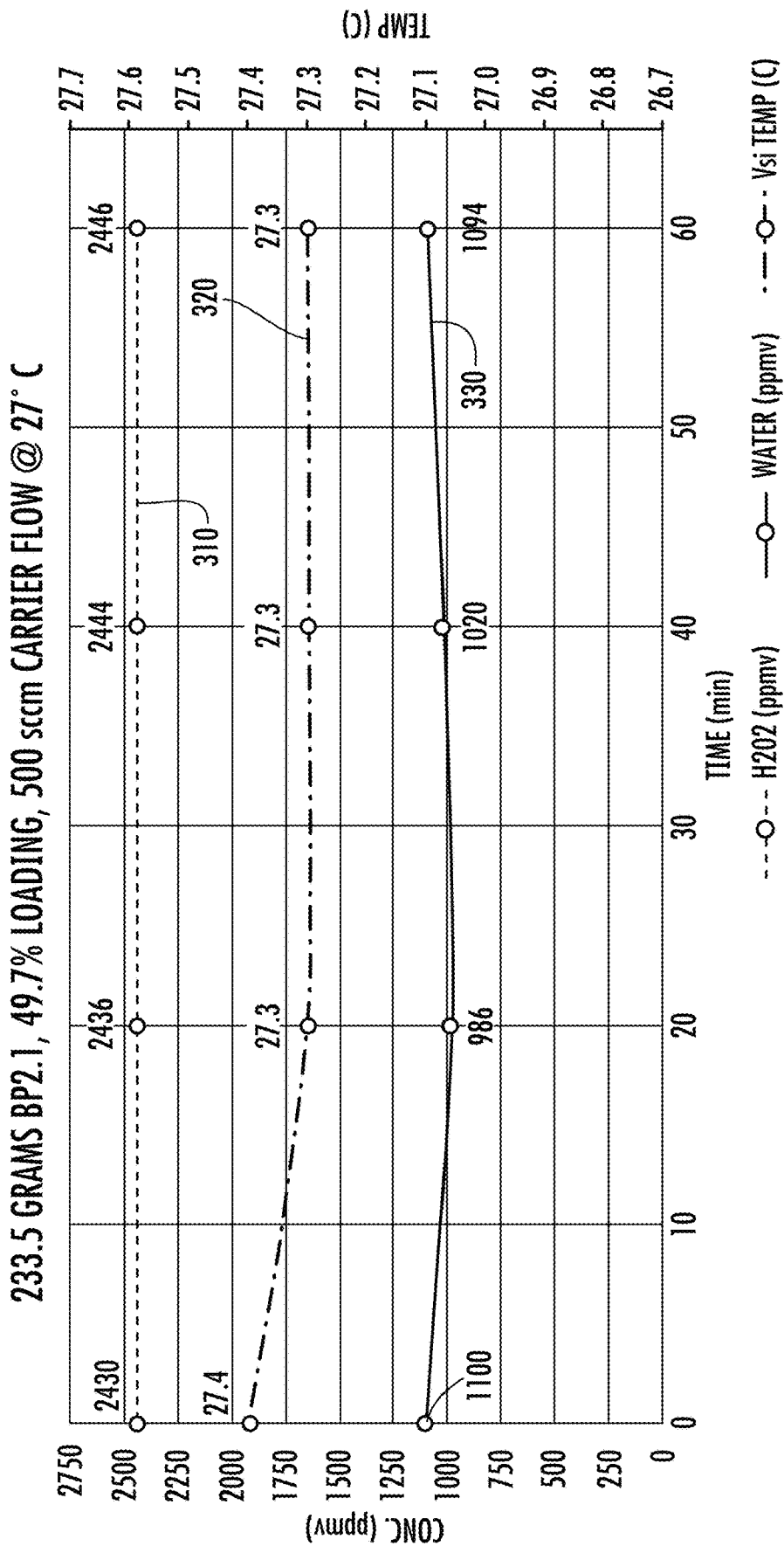
FIG. 3 shows a measurement of the output from a hydrogen peroxide source vessel, as measured by FTIR, in accordance with some embodiments.

System 100 in FIG. 1 was used to perform all of the hydrogen peroxide plasma etches in this example. The system used a 13.56 MHz RF generator. The experimental etch parameters for the four coupons from each of the two wafers in this example are summarized in Table 2. Etch time was held constant at 10 minutes for all tests. FIG. 3 shows a measurement of the output from the hydrogen peroxide source vessel (110 in FIG. 1), as measured by FTIR before the etch tests. The gas output from the vessel had an average hydrogen peroxide vapor concentration 310 of about 2,400 ppmv, and an average water concentration 330 of about 1,000 ppmv, at a carrier flow of 500 sccm and vessel shell temperature 320 ("Vsi Temp") of 27° C. The ambient temperature in the lab determined the hydrogen peroxide source vessel shell temperature 320, which ranged from 25.5° C. to 29° C. As it is understood, the hydrogen peroxide and water concentration from a hydrogen peroxide source vessel varies directly with temperature, and in this case the lack of temperature control for the vaporizer vessel is a source of variability.

TABLE 2

Hydrogen peroxide plasma-etch parameters for coupons from wafers 67ZSG2 and 68ZSD1. ("X" indicates missing data.)

| Plasma Etch Settings | Test Coupon | 1 A1-68ZSD1 | 2 A2-67ZSG2 | 3 B1-68ZSD1 | 4 B2-67ZSG2 | 5 C1-68ZSD1 | 6 C2-67ZSG2 | 7 D1-68ZSD1 | 8 D2-67ZSG2 |
| --- | --- | --- | --- | --- | --- | --- | --- | --- | --- |
| RF Power | watt | 125 | 125 | 50 | 50 | 50 | 50 | 125 | 125 |
| Ref: Max/Min | watt | X/8 | 10/7 | 0/0 | 0/0 | 6/6 | 6/6 | 0/0 | 0/0 |
| Duration | min | 10 | 10 | 10 | 10 | 10 | 10 | 10 | 10 |
| Chamber Flow | cc/min | 50 | 50 | 10 | 10 | 50 | 50 | 10 | 10 |
| Pressure Start | mTorr | 730 | 730 | 280 | 270 | 730 | 730 | 300 | 300 |
| Pressure End | mTorr | 630 | 620 | 210 | 210 | 670 | 670 | 220 | 220 |
| Vac Setting | mTorr | 550 | 550 | 250 | 250 | 550 | 550 | 250 | 250 |
| Vsi Temp | C. | 29 | 28 | 28 | 28 | 26 | 26 | 26 | 25.5 |

"Ref" in Table 2 refers to the RF energy that is reflected back into the RF generator. This energy can be simply considered as energy that is not available to perform etching, so lower reflected energies are desirable for more efficient etch results. In these tests, higher reflected energies occurred during the four tests run with the higher pressure conditions, and it was evident from the results (e.g., FTIR spectra after the test) that the AHM removal was inferior compared to the etches run at the lower pressure conditions. When the pressure was high, the reflected RF energy was high at both low- and high-power settings. The hardware of the etcher did not change between the tests. Not to be limited by theory, these results may indicate that the higher concentration of ions in the chamber contributed to the RF energy being reflected back, potentially limiting the free mean path of ions available to react with the surface. "X" indicates a data point that was not collected on the first sample.

As shown in Table 2, pressure changes occurred during all the etch periods. After an initial gas stabilization period, peak pressure occurred moments after the plasma was struck, and then the pressure gradually decreased throughout the duration of the etch. The greatest pressure drop occurred in the high-power/high-pressure Test 2 (difference of 110 mTorr from Pressure Start 730 mTorr to Pressure End 620 mTorr), and the smallest pressure drop occurred in Test 4 (60 mTorr), which was run with the low-power/low-pressure conditions.

Variations in substrate temperature can also affect etch efficiency, as the common effect for most materials is the higher process temperatures to promote faster etch rates. The plasma etch systems (e.g., 100 in FIG. 1) described herein can be "cold" plasma systems, wherein heat is generated by the plasma, and materials being processed can heat up during plasma etching. In other cases, the systems described herein can include active temperature control systems, for example, including sample (or substrate) heating and/or cooling elements. It was observed that the perforated aluminum sample tray heated considerably during the 10-minute etches, such that it was hot to the touch (e.g., greater than about 50° C.) when removing the coupon after the run. Thus, in the subsequent test, the next coupon placed on the tray could experience some preheating, as the tray was not allowed to fully cool to room temperature between etch tests, for this delay would have caused the etch experiments to take an excessive amount of time. Instead, a two-minute "dummy" plasma cycle was performed before each change in power level to preheat the tray, imparting some preheating to all the coupons. For better process control and uniformity, a temperature control system can be used to maintain constant temperatures in the chamber during processing.

Because the results were definitive, with each test condition producing significant differences, the aforementioned sources of variation did not cast ambiguity on the overall determination that the hydrogen peroxide plasma chemistry used in these tests can remove the AHMs and does so more effectively under some conditions than others.

FIGS. 4A-7B show FTIR results from this example. The FTIR data was obtained using a Thermo-Scientific Nicolet 6700 FTIR Spectrometer with a MCT/A Detector. FTIR spectra 410a-b, 510a-b, 610a-b, and 710a-b in FIGS. 4A-7B show the data before etching, and FTIR spectra 420a-b, 520a-b, 620a-b, and 720a-b show the results after etching.

Figure 4A:
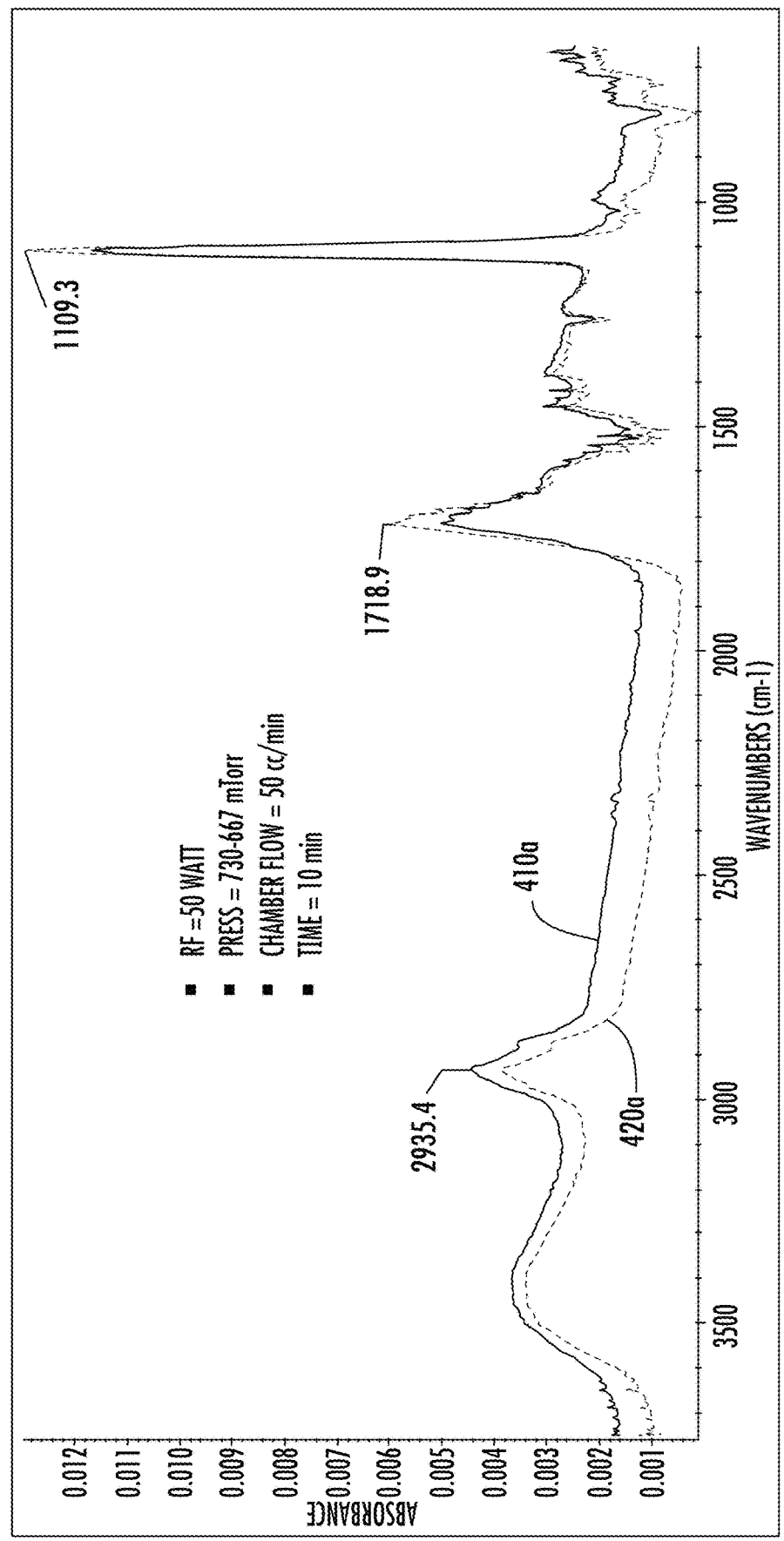
Figure 4B:
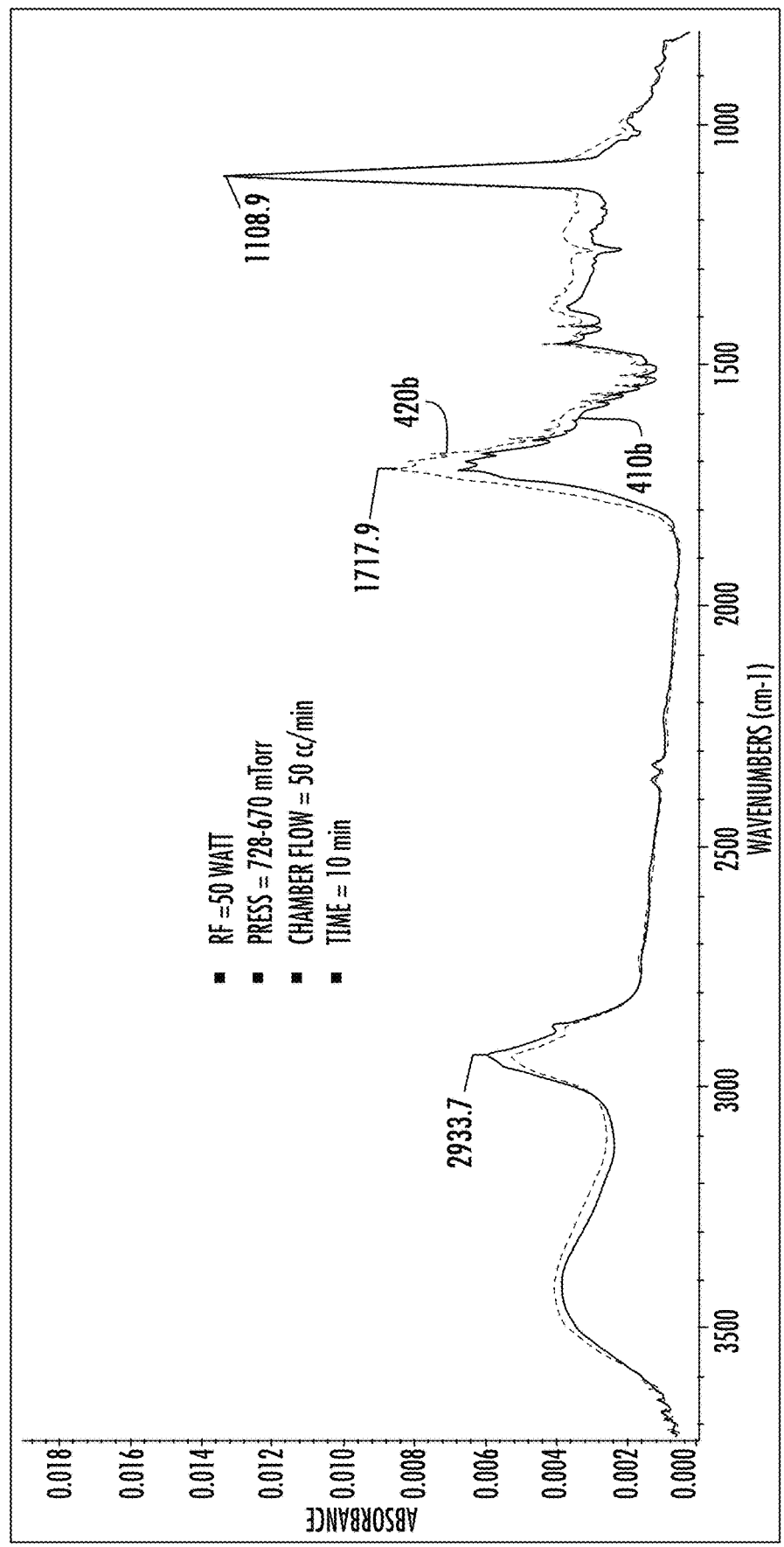

FIGS. 4A and 4B show results from low power/high pressure conditions (Tests 5 and 6, respectively). These parameters resulted in the least effective removal of the AHM among the four conditions. The appearance of the masks was unchanged, and the FTIR data corroborated the visual evidence. As shown in FIGS. 4A and 4B, the magnitude of the carbon-bearing compounds at about 2935 cm$^{-1}$ and about 1720 cm$^{-1}$ were only minimally reduced between FTIR spectra 410a (before etch) and 420a (after etch), and between FTIR spectra 410b (before etch) and 420b (after etch).

Figure 5A:
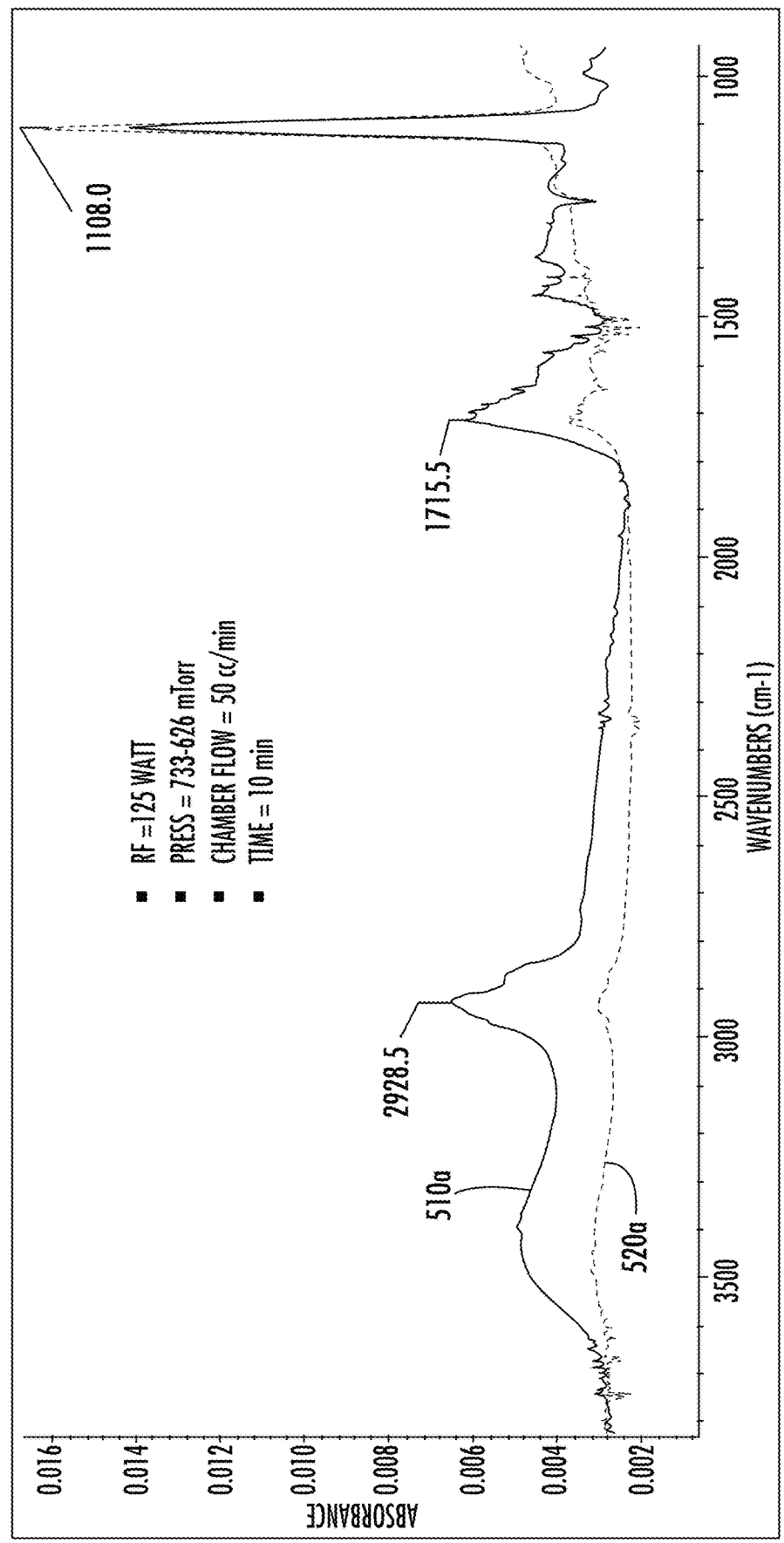
Figure 5B:
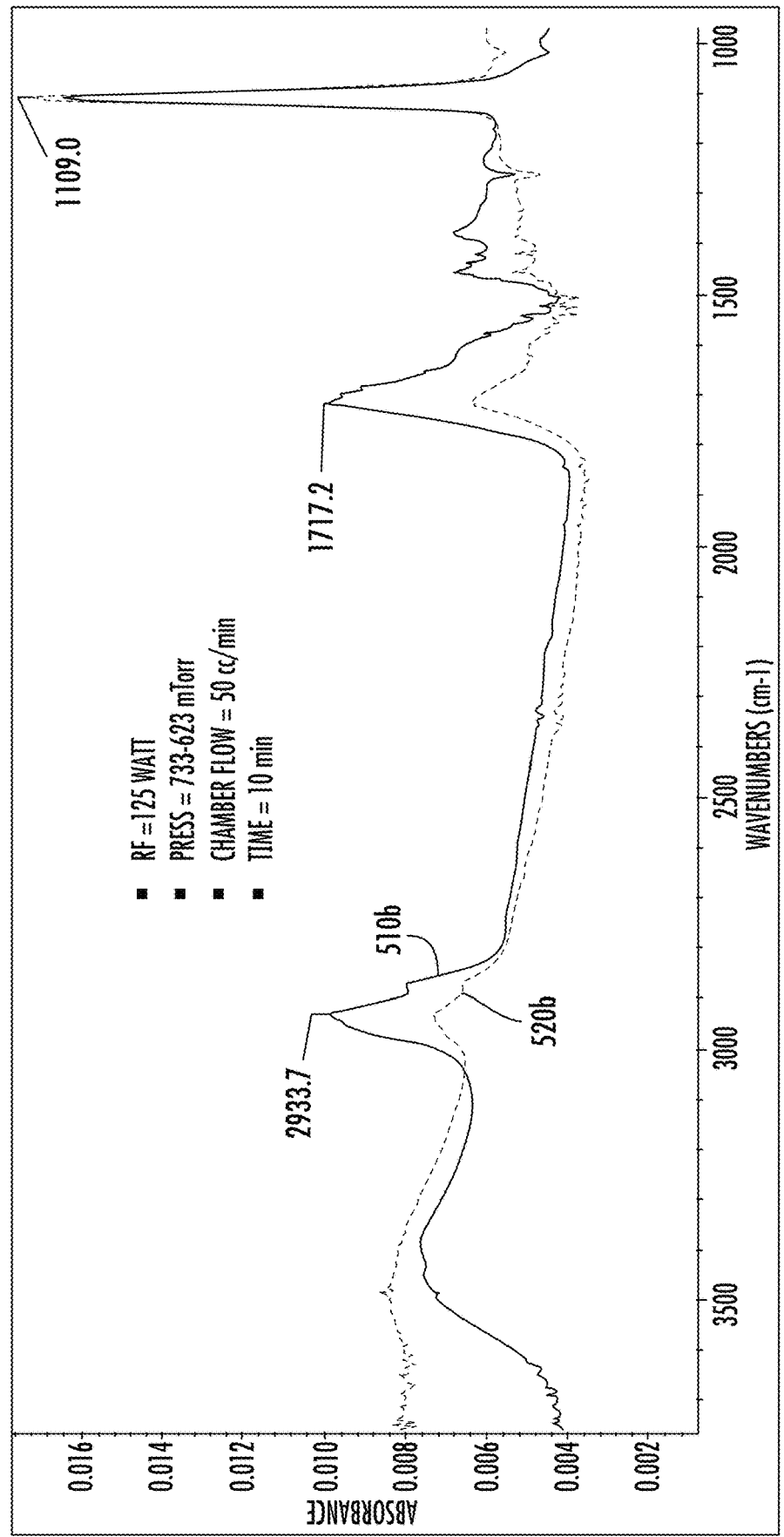

FIGS. 5A and 5B show results from high power/high pressure conditions (Tests 1 and 2, respectively). Combining high power with high pressure provided more effective etch conditions than low power/high pressure, but a significant amount of the AHM remained. As shown in FIGS. 5A and 5B, the magnitude of the carbon-bearing compounds at about 2935 cm$^{-1}$ and about 1720 cm$^{-1}$ were only somewhat reduced between FTIR spectra 510a (before etch) and 520a (after etch), and between FTIR spectra 510b (before etch) and 520b (after etch). There is also notable enlargement of the Si—O—Si peak at about 1110 cm$^{-1}$ after etching, indicating that the base silicon substrate may also have been affected by the etch process.

FIGS. 6A and 6B show results from low power/low pressure conditions (Tests 3 and 4, respectively). These parameters resulted in nearly complete removal of the AHM, as the carbon compound peaks were reduced to near trace levels, as shown in FTIR spectra 620a (after etch) and 620b (after etch) in FIGS. 6A and 6B compared to spectra 610a (before etch) and 610b (before etch). However, peak size of the carbon compounds on coupon B2-67ZSG2 after etching (in FTIR spectra 620b) are larger than those on B1-68ZSD1 (in FTIR spectra 620a), indicating this low power/low pressure etch was less effective in removing the AHM from B2-67ZSG2, possibly due to its greater thickness. Additional power and/or process time may have been required to fully remove the AHM from B2-67ZSG2.

Common among the FITR spectra for both the low power/low pressure etch Tests 3 & 4 and the less effective high power/high pressure Tests 1 & 2 was an enlargement of the Si oxide structure at about 1110 cmi, possibly indicating the formation of additional oxides on the silicon matrix. This may also indicate excessive ion bombardment, which could roughen the silicon surface and lead to undesirable damage. However, the etching time for these examples was not optimized, and any exposure to the plasma after the AHM has been removed may contribute to the alteration of the silicon substrates. Due to the unoptimized etch time, the etch efficiency was also lessened in this example due to unproductive time spent etching the substrate after the AHM has been completely removed. The etch process duration could be optimized to result in complete film removal without extra expenditures of power and time, which could also lessen undesirable damage to the substrate.

Figure 7A:
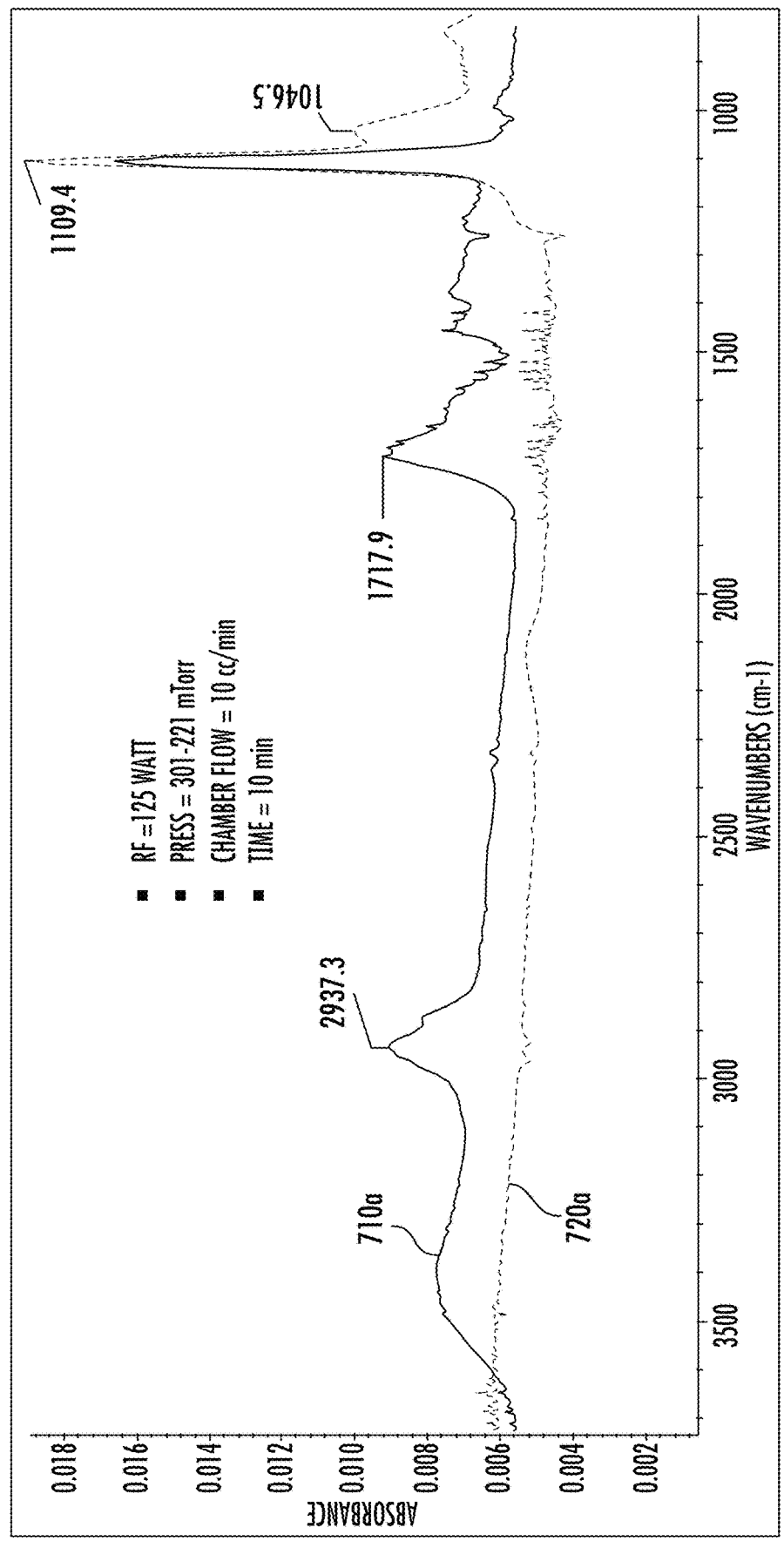
Figure 7B:
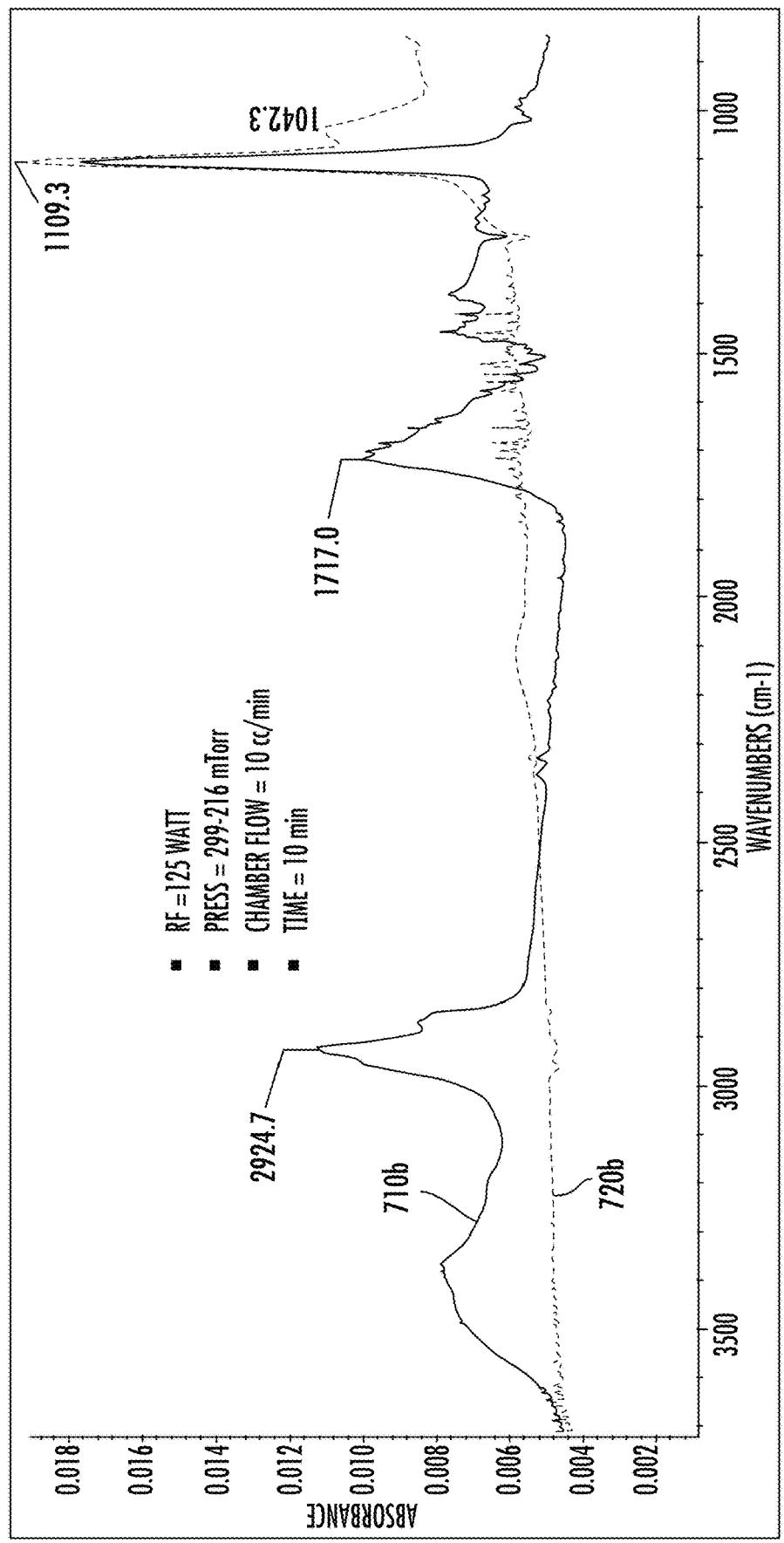

FIGS. 7A and 7B show results from high power/low pressure conditions (Tests 7 and 8, respectively). The spectra 720a (after etch) and 720b (after etch) in respective FIGS. 7A and 7B show the most complete removal of the AHM compared to spectra 710a (before etch) and 710b (before etch). The small sharp peaks ranging from about 1850 cm$^{-1}$ to about 1400 cm$^{-1}$ after etching should not be construed as residue from the AHM but is noise (e.g., water), which was obscured by the larger AHM peak at about 1720 cm$^{-1}$ in the spectrum taken before etching. As shown in the contact angle results below, the exposure to the hydrogen peroxide plasma during the etching made the surface strongly hydrophilic. Not to be limited by theory, this may explain the increased magnitude of water peaks observed in the FTIR spectra since evaporation of water from the oxidized silicon surface may have been inhibited due to a significant increase in hydrophilicity.

Again, an enlargement of the Si—O—Si peak at about 1110 cm$^{-1}$ is evident in spectra 720a and 720b in FIGS. 7A and 7B, but is also accompanied by the formation of another oxide of silicon structure at about 1040 cm$^{-1}$. This peak, which was not observed in the other etch tests, suggests more intensive oxidation of the silicon substrate, and possible damage due to increased ion bombardment. Therefore, while the parameters of high power/low pressure may have resulted in the most complete removal of the AHM, further optimizations could be made (e.g., the RF power could be reduced, and/or the duration optimized), which could result in effective removal of the AHM without increased oxidation of the silicon substrate.

Regardless of the power setting, it is evident from the tests in this example that the lower process pressures provide for more effective etching than the high process pressures, possibly due to increased free mean path to promote ion interaction with the sample surface.

The hydrogen peroxide plasma etch conditions, such as power, pressure, time, temperature, and plasma chemistry can be optimized to remove an AHM from a substrate with minimal oxidation and/or damage to the substrate (or films, or structures on the substrate, such as metal, insulator, or semiconductor films). For example, powers and pressures less than, greater than, or between those used in the tests in this example could be used. The hydrogen peroxide concentration in the plasma could be varied, for example, by controlling the temperature of the hydrogen peroxide source vessel. The carrier gas flow could be controlled and varied as well.

Table 3 shows etch conditions used for contact angle measurements in this Example. Since plasma run at low pressure proved most effective at removing the AHM, it was decided that taking contact angle measurements on samples run at higher pressures would be of limited value. Therefore, low pressure etches at high and low power settings were performed on two new coupons from each wafer, duplicating the same parameters used on the initial set of coupons.

For these tests, the coupon pairs from each wafer were etched together, as shown in Table 3.

TABLE 3

Plasma etch parameters for contact angle test coupons from wafers 67ZSG2 and 68ZSD1.

| Plasma Etch Settings | Test Coupon | Low Power/Low Pressure Etch S1 | | High Power/Low Pressure Etch S2 | |
|---|---|---|---|---|---|
| | | S1-68ZSD1 | S1-67ZSG2 | S2-67ZSG2 | S2-67ZSG2 |
| RF Power | watt | 50 | 50 | 125 | 125 |
| Ref: Max/Min | watt | 0/0 | 0/0 | 0/0 | 0/0 |
| Duration | min | 10 | 10 | 10 | 10 |
| Chamber Flow | cc/min | 10 | 10 | 10 | 10 |
| Pressure Start | mTorr | 270 | 270 | 290 | 290 |
| Pressure End | mTorr | 210 | 210 | 210 | 210 |
| Vac Setting | mTorr | 250 | 250 | 250 | 250 |
| Vsi Temp | C. | 28 | 28 | 28 | 28 |

The pre- and post-etch contact angle measurements are shown in Table 4. The contact angle measurements in this example were obtained using a Biolin Scientific Theta-Lite Optical Tensiometer, +/−0.1° accuracy with 0-180° range droplet angle. To assess the degree to which the silicon side of the coupon was being affected by the plasma, which in the chamber is facing down and in contact with the perforated aluminum sample tray, contact angles were measured on both sides of the coupon. The silicon side is the side of the substrate opposite the AHM coating. Clearly, the side with the AHM coating was more severely affected, as indicated by the greater difference in contact angle before and after etching. But the significant decrease in contact angles on the silicon side after etching may corroborate the FTIR data that showed an increased peak size of the Si—O—Si peaks. These results also showed an increase in the formation of silicon oxides on the coupons etched at the high power/low pressure parameter.

TABLE 4

Contact angle results for samples etched at low pressure and low and high power.

| Contact Angle | Pre-Etch | | ETCHED | | | Difference | |
|---|---|---|---|---|---|---|---|
| Coupon | AHM | Si_side | AHM | Si_side | Plasma | AHM | Si_side |
| S1-68ZSD1 | 73 | 53 | 6 | 11 | 50 watt/Low Pressure | 67 | 42 |
| S1-67ZSG2 | 79 | 65 | 3 | 19 | 50 watt/Low Pressure | 76 | 46 |
| S2-68ZSD1 | 68 | 54 | NV | 12 | 125 watt/High Pressure | — | 42 |
| S2-67ZSG2 | 73 | 57 | NV | 14 | 125 watt/High Pressure | — | 43 |

The contact angle values in Table 4 are averages of the all measurements taken over an 8-second sample period, with the method used such that the high-speed camera of the Biolin tensiometer took 410 individual photos during the sample period. (The sample period is a user-changeable variable in the method, as measurements on slightly absorbent surfaces must be performed in brief sample intervals by necessity.) With the tensiometer used in this example, repeatable results are typically best achieved with a droplet size of 1 µL to 10 µL. Additionally, larger droplets are typically more affected by gravity than smaller ones, leading to a bias towards higher contact angle (more hydrophobicity) in the measurement of the surface. The AHM side of the S2-coupons in this example did not provide a measurable droplet angle following the etch because of high hydrophilicity, resulting in test droplets spreading out in an irregular shape.

Figure 8A:
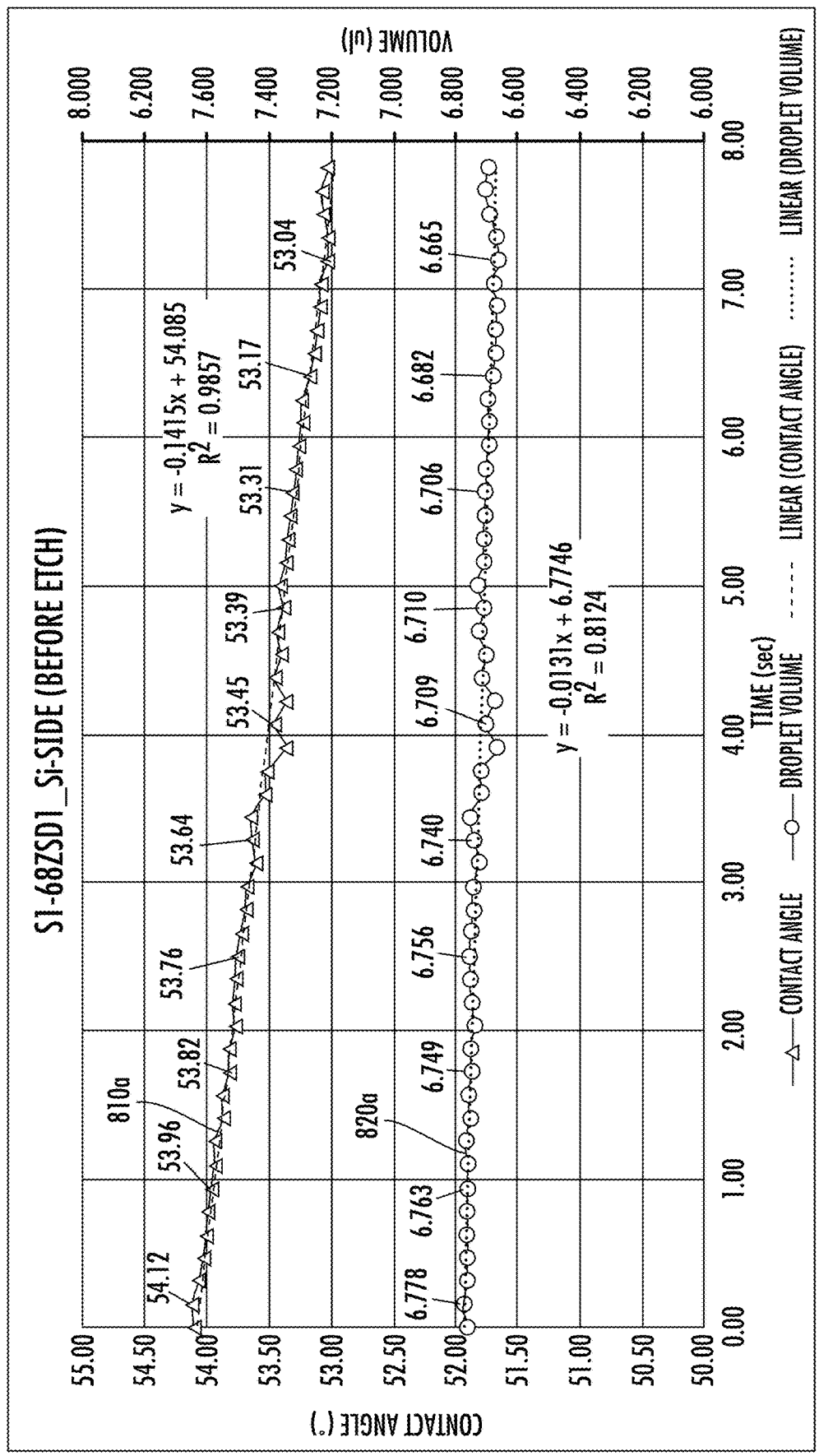
FIGS. 8A and 8B show measurements of unetched silicon sides of coupons from two wafers.
Figure 8B:
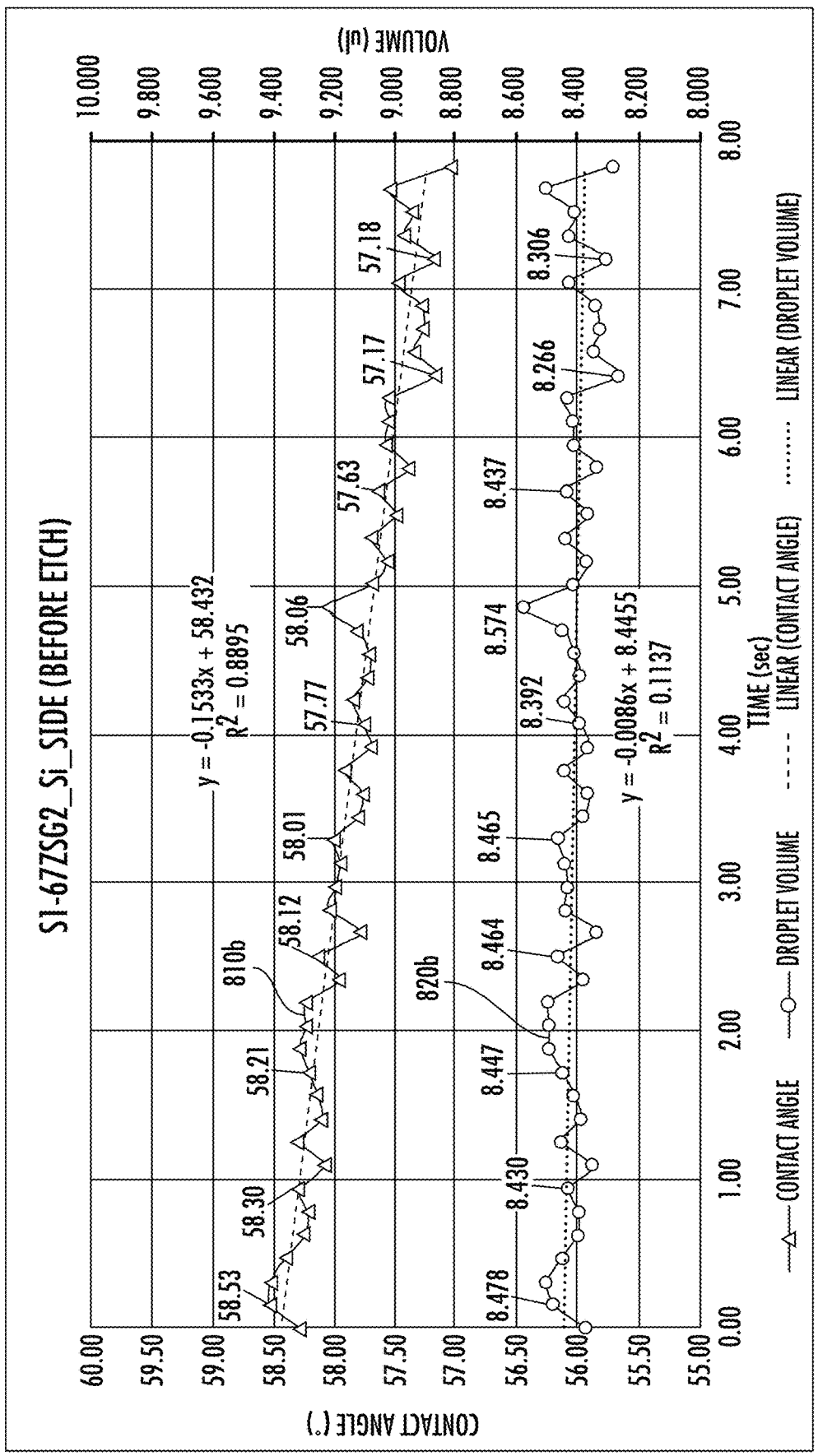

FIGS. 8A and 8B show measurements of the unetched silicon side of coupons from the two wafers over the 8-second sample period. FIG. 8A shows measured contact angle 810a and measured droplet volume 820a for one wafer, and FIG. 8B shows measured contact angle 810b and measured droplet volume 820b for the other wafer. As the droplet lost volume due to evaporation during the measurements, the measured contact angles 810a and 810b (FIGS. 8A and 8B) of the two wafers decreased slightly. The effect of the reduction in droplet volume 820a and 820b (FIGS. 8A and 8B) on the silicon surface appears minimal, even with droplet size varying as much as 2 µL between the data shown in respective FIGS. 8A and 8B. Other types of measurement errors can also occur, such as how the image is recorded can produce some oscillations depending on the resolution of the monitor. The impact of the measurement inconsistencies was reduced by reporting the final contact angle value as the average of all the measurements over the measurement period as shall be described in FIGS. 9A-9B.

A significant factor in measurement consistency is the sample surface itself, and a clean and uniform surface condition is required to get representative and repeatable measurements. For the AHM samples in this example, the history of the wafers prior to the experiments described herein was unknown, which may account for some of the contact angle variability from coupon to coupon. Scratches and minor abrasion were also evident in some areas on the wafers, which would have made it difficult to draw conclusions from minor changes in contact angle. Despite the minor variabilities in the data in this example, the extreme differences between the pre-etch and post-etch measurements provide unambiguous data of the effectiveness of the hydrogen peroxide plasma in altering the sample surface.

Figure 9A:
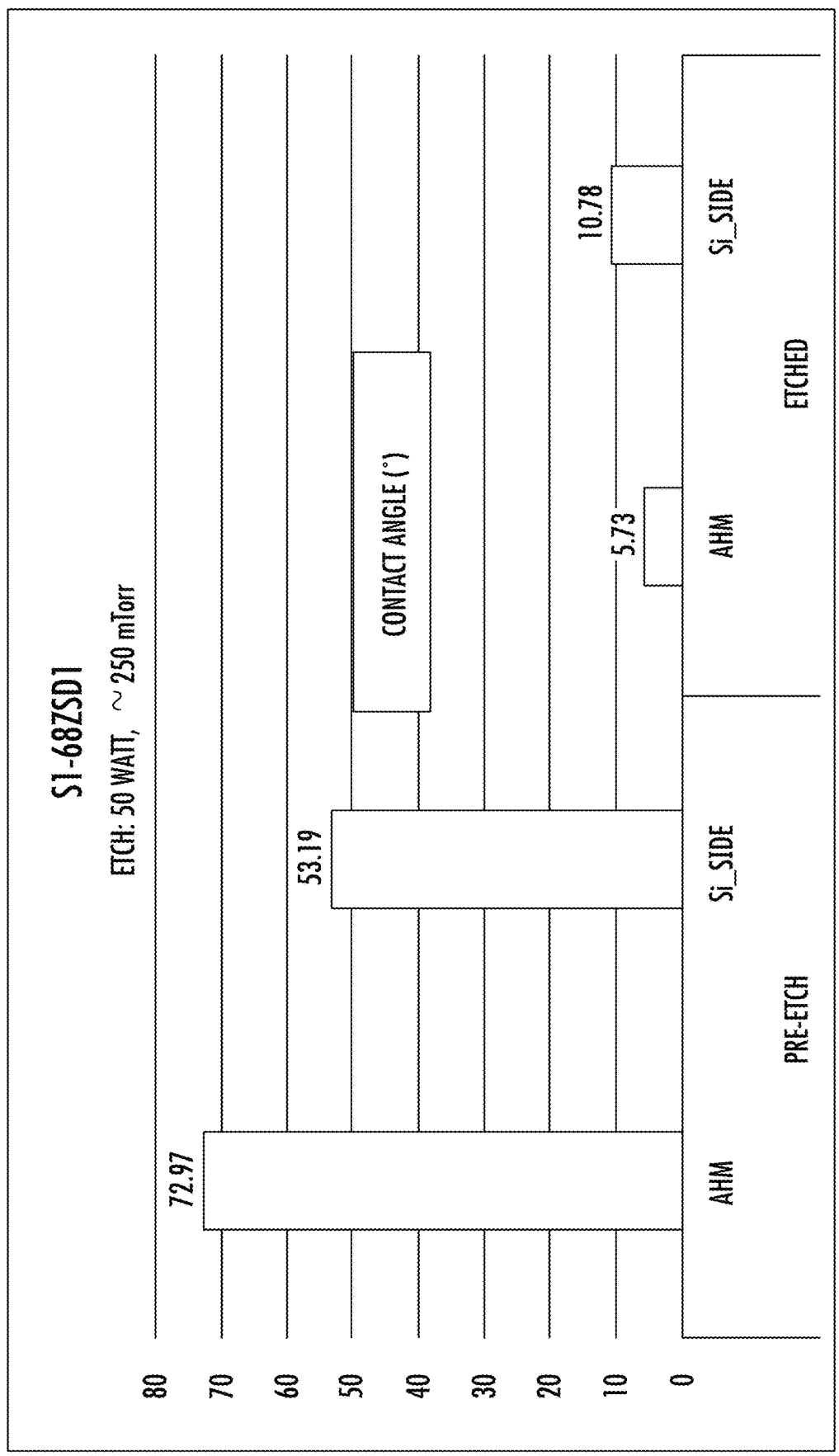
FIGS. 9A-9B show the contact angle test data in Table 4 graphically.
Figure 9B:
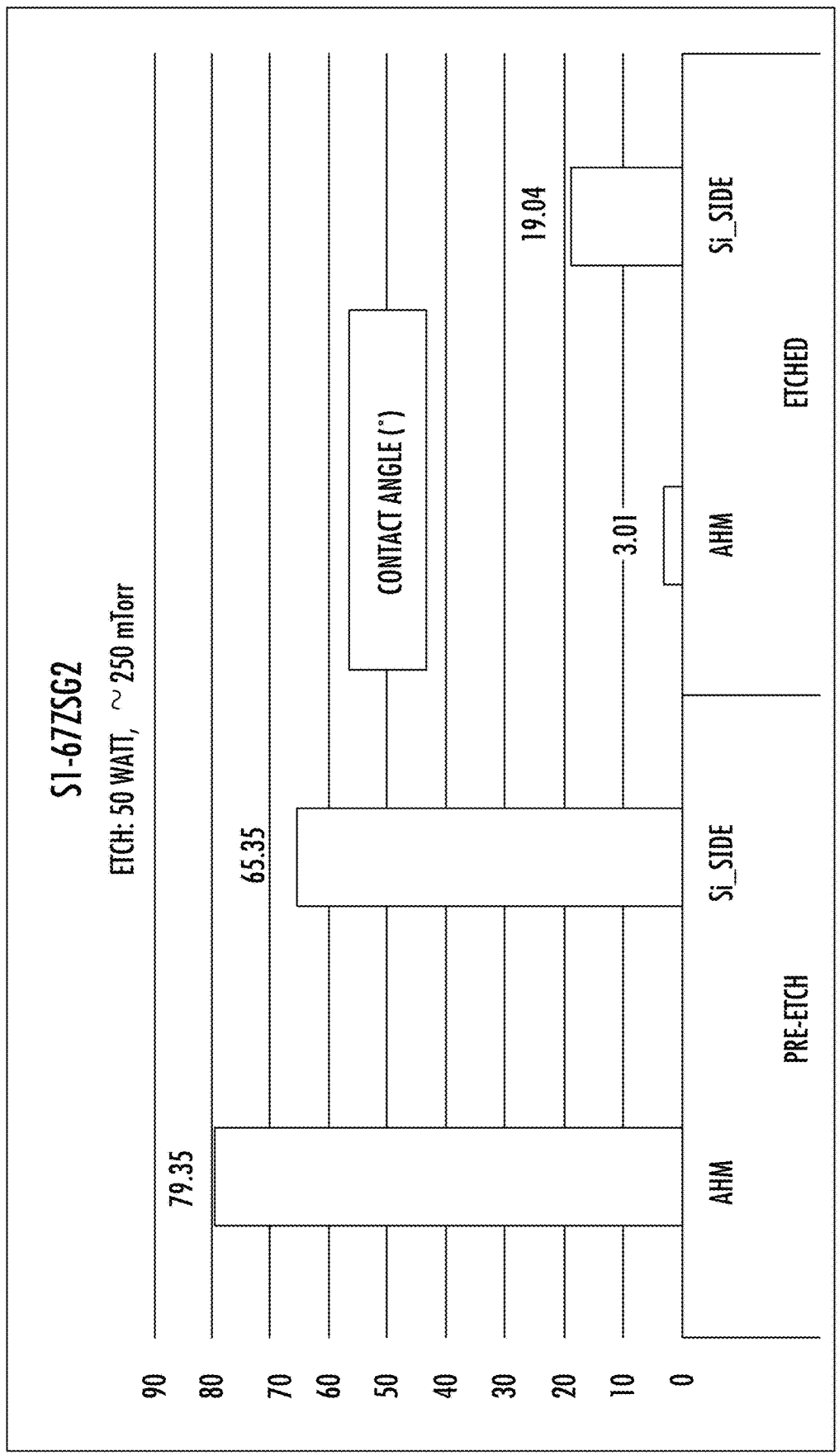
Figure 9D:
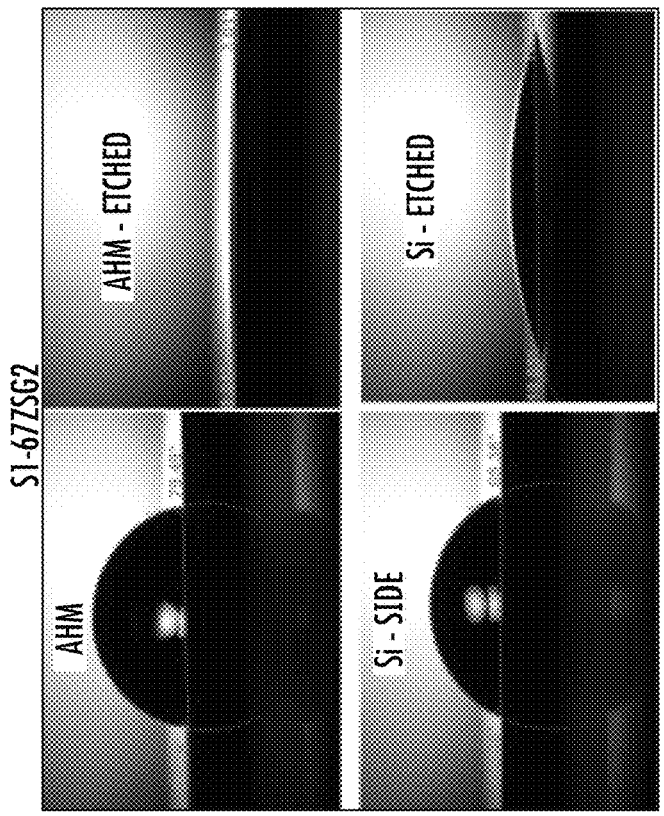
FIGS. 9C and 9D show snap shots of contact angles from the tests, in accordance with some embodiments.
Figure 9C:
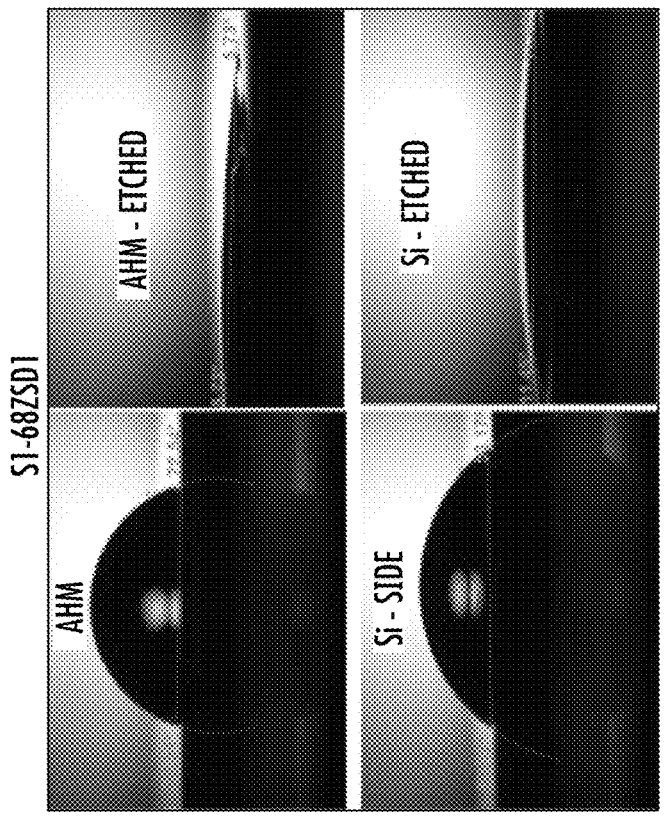

FIGS. 9A-9B show the average contact angle test data in Table 4 graphically, and FIGS. 9C and 9D show contact angle images from the tests. The changes observed on the silicon side of the coupon (the back side) indicates that the etching occurs on all areas around the wafer, and therefore a stack of samples with AHMs can be etched using a hydrogen peroxide plasma. For example, spacers (or stand-offs) can be used to separate samples (e.g., wafers) in a stack, and the hydrogen peroxide plasma can etch the AHMs from all of the samples simultaneously. In some cases, the back side of a sample (e.g., a wafer containing sensitive coatings and/or features on the back side) can be protected from the hydrogen peroxide plasma during the etching of an AHM coating on the front side of the sample. For example, two wafers can be placed back-to-back to protect the back sides of the wafers during AHM etching. In some cases, specialized tooling (e.g., wafer holders) can be used during etching to prevent plasma species from reaching the back sides or to reduce the concentration of plasma species at the back sides.

The results from the tests in this example show that a hydrogen peroxide plasma can be used to remove an AHM from a silicon substrate. An RF plasma at 13.56 mHz struck from a vapor consisting of hydrogen peroxide at a concentration of over 2,000 ppmv and a moisture level of approximately 1,000 ppmv, introduced using a dry nitrogen carrier gas, showed effectiveness in etching the AHM on silicon wafers at power levels ranging from 50 watts to 125 watts and a process time of 10 minutes. Differences in FTIR spectra and contact angle were used to confirm the degree of effectiveness. The hydrogen peroxide plasma produced a reactive ion etch of both the AHM film and the silicon substrate of the coupons. Contact angle measurements confirmed both sides of the coupon became significantly more hydrophilic after the etch. Plasma etching with the hydrogen peroxide vapor at low pressures (e.g., about 250 mTorr) was more effective at removing the AHM than at higher pressures (e.g., greater than about 600 mTorr).

Comparative Example: AHM Etching Using Oxygen Plasma

This comparative example shows that oxygen can also be used to remove an AHM, however, the oxygen plasma was found to be more aggressive than hydrogen peroxide plasma. Therefore, the previous example and this comparative example show that hydrogen peroxide plasma can be as effective at removing an AHM as an oxygen plasma, and that using a hydrogen peroxide plasma can be advantageous, since it can be less damaging to underlying and/or adjacent films and/or structures.

In this comparative example two silicon wafers with AHMs were etched using a plasma containing oxygen species (i.e., an oxygen plasma) rather than a hydrogen peroxide plasma. This comparative example shows that oxygen plasma can be used to remove an AHM, however, oxygen plasma etching was found to be more aggressive than hydrogen peroxide plasma of AHMs. The aggressiveness of the oxygen plasma compared to the hydrogen peroxide plasma can be detrimental, for example, it is more likely to impact (e.g., oxizide or etch) adjacent or underlying layers or structures, and is generally harder to control (e.g., harder to avoid damaging an underlying surface after the AHM has been substantially removed).

Figure 10:
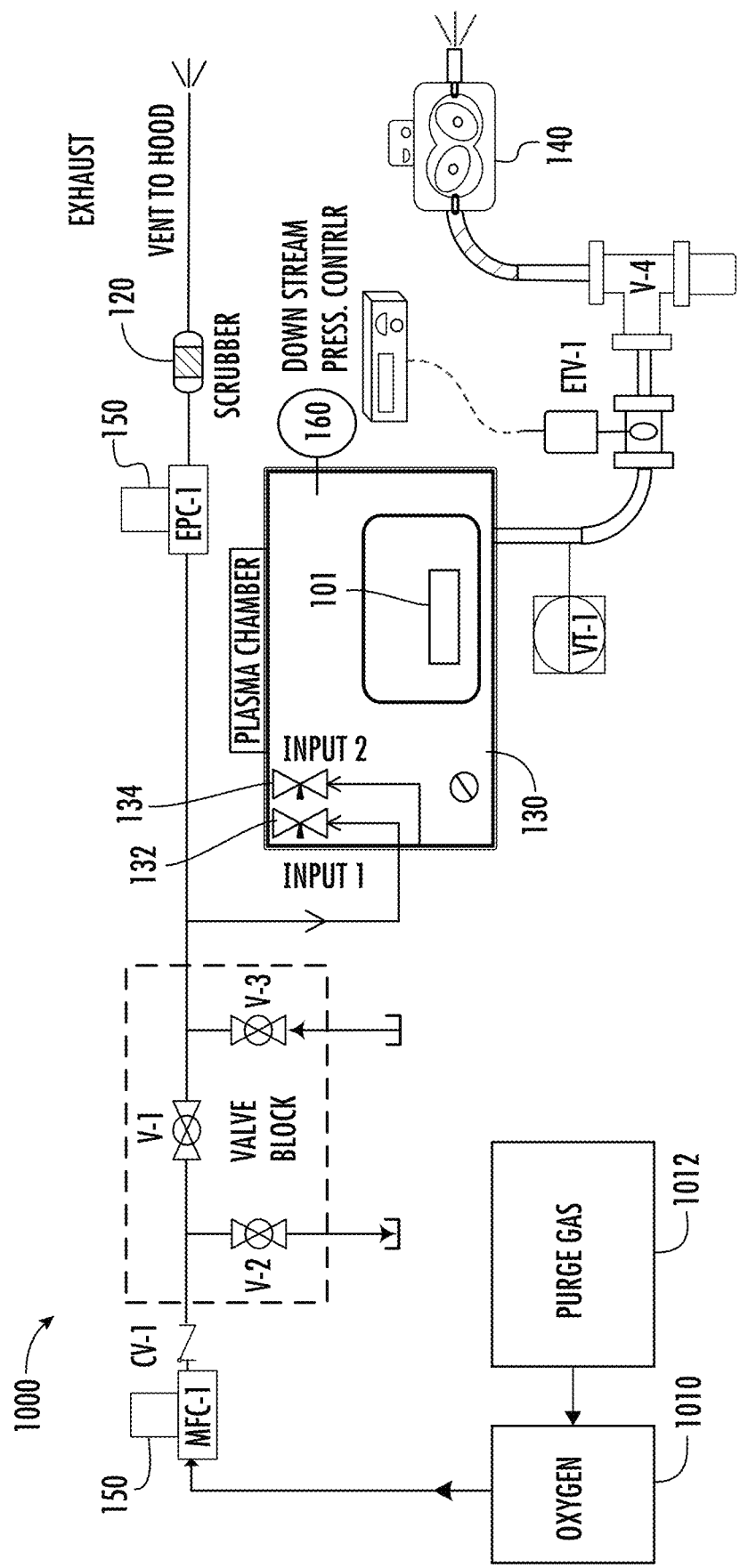
FIG. 10 is a schematic of a system that can be used to etch wafers with AHMs using an oxygen plasma.

System 1000 in FIG. 10 was used to perform the etch tests of this comparative example wherein oxygen gas from an oxygen source 1010 was delivered to plasma chamber 130. A "purge gas" source 1012 is also shown, which can supply an inert gas (e.g., nitrogen) to purge the system, for example, to purge oxygen or other hazardous gases during operation, for maintenance, or for safety reasons. Coupons (1"×1" square, approximately) were cut from each processed wafer to undergo FTIR analysis in a 2×2 experimental design in which the independent variables were RF power and chamber pressure, and the two levels were high and low, as shown in Table 1. The substrates (silicon wafers) were placed on a perforated aluminum sample tray and etched using the oxygen plasma for 10 minutes in the tests for this comparative example. The silicon wafers and AHM films in this comparative example were the same as those used in the example above, whose FTIR spectra are shown in FIG. 2, and are described in the example above.

System 1000 in FIG. 10 was used to perform the oxygen plasma etches in this example. The system used a 13.56 MHz RF generator. The experimental etch parameters for the four coupons from each of the two wafers in this example are summarized in Table 5. Etch time was held constant at 10 minutes for all tests. As in the example above, a two-minute "dummy" plasma cycle was performed before each change in power level to preheat the tray, imparting some preheating to all the coupons.

TABLE 5

| | | Oxygen plasma-etch parameters for coupons from wafers 67ZSG2 and 68ZSD1. | | | | | | | |
|---|---|---|---|---|---|---|---|---|---|
| Plasma Etch Settings | Test Coupon | 13 H1-68ZSD1 | 18 H2-67ZSG2 | 14 I1-68ZSD1 | 19 I2-67ZSG2 | 15 J1-68ZSD1 | 20 J2-67ZSG2 | 17 K1-68ZSD1 | 21 K2-67ZSG2 |
| RF Power | watt | 125 | 125 | 125 | 125 | 50 | 50 | 50 | 50 |
| Ref: Max/Min | watt | 0/0 | | 1/1 | | 0/0 | | 0/0 | |
| Duration | min | 10 | 10 | 10 | 10 | 10 | 10 | 10 | 10 |
| Oxygen Flow | cc/min | 250 | 250 | 250 | 250 | 250 | 250 | 250 | 250 |
| Pressure | mTorr | 225 | 225 | 550 | 550 | 550 | 550 | 225 | 225 |
| Vac Setting | mTorr | 200 | 200 | 500 | 500 | 500 | 500 | 200 | 200 |

Figure 11:
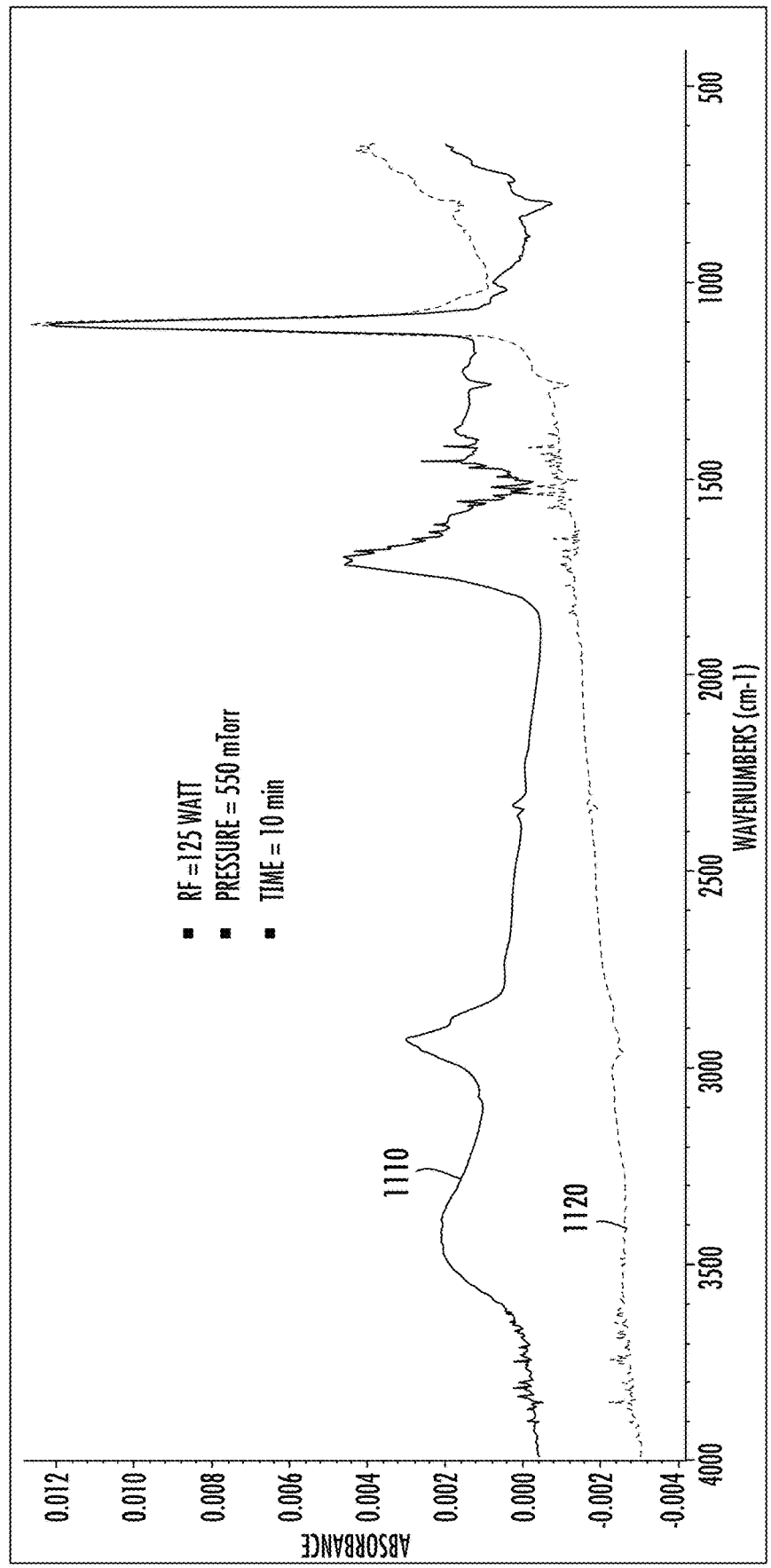
FIGS. 11-14 show FTIR results from a comparative example to etch wafers with AHMs using an oxygen plasma.
Figure 12:
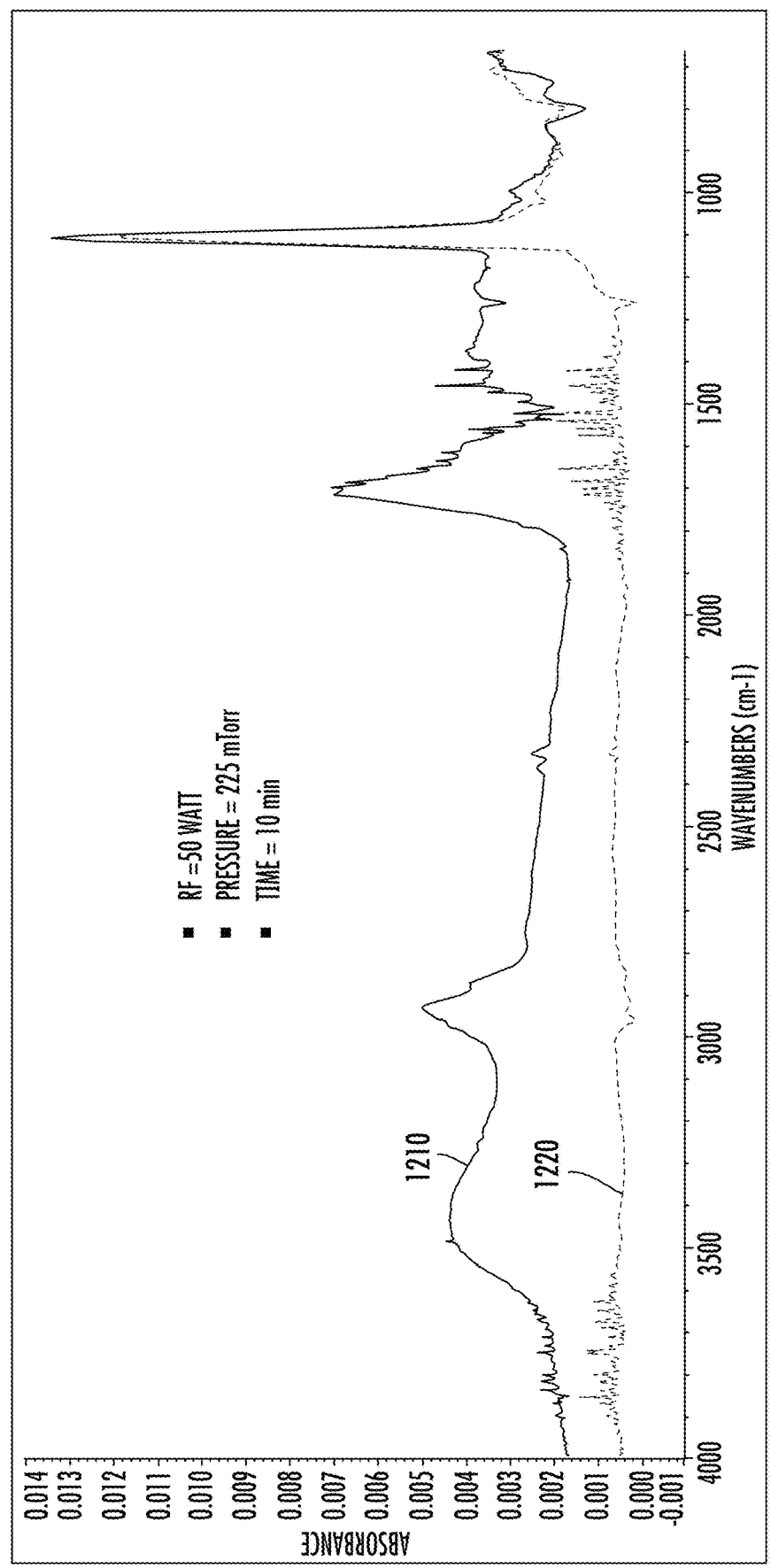
Figure 13:
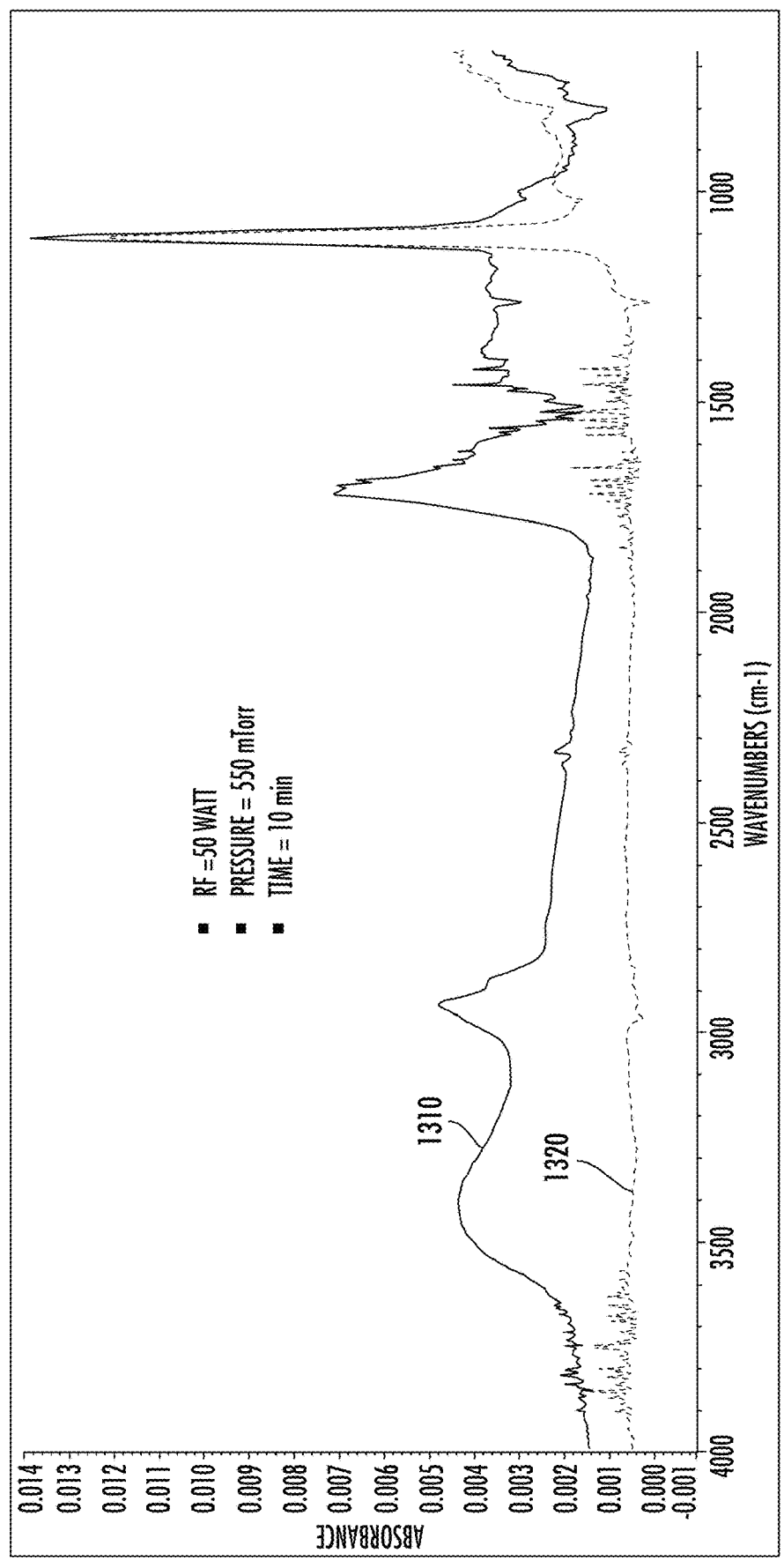
Figure 14:
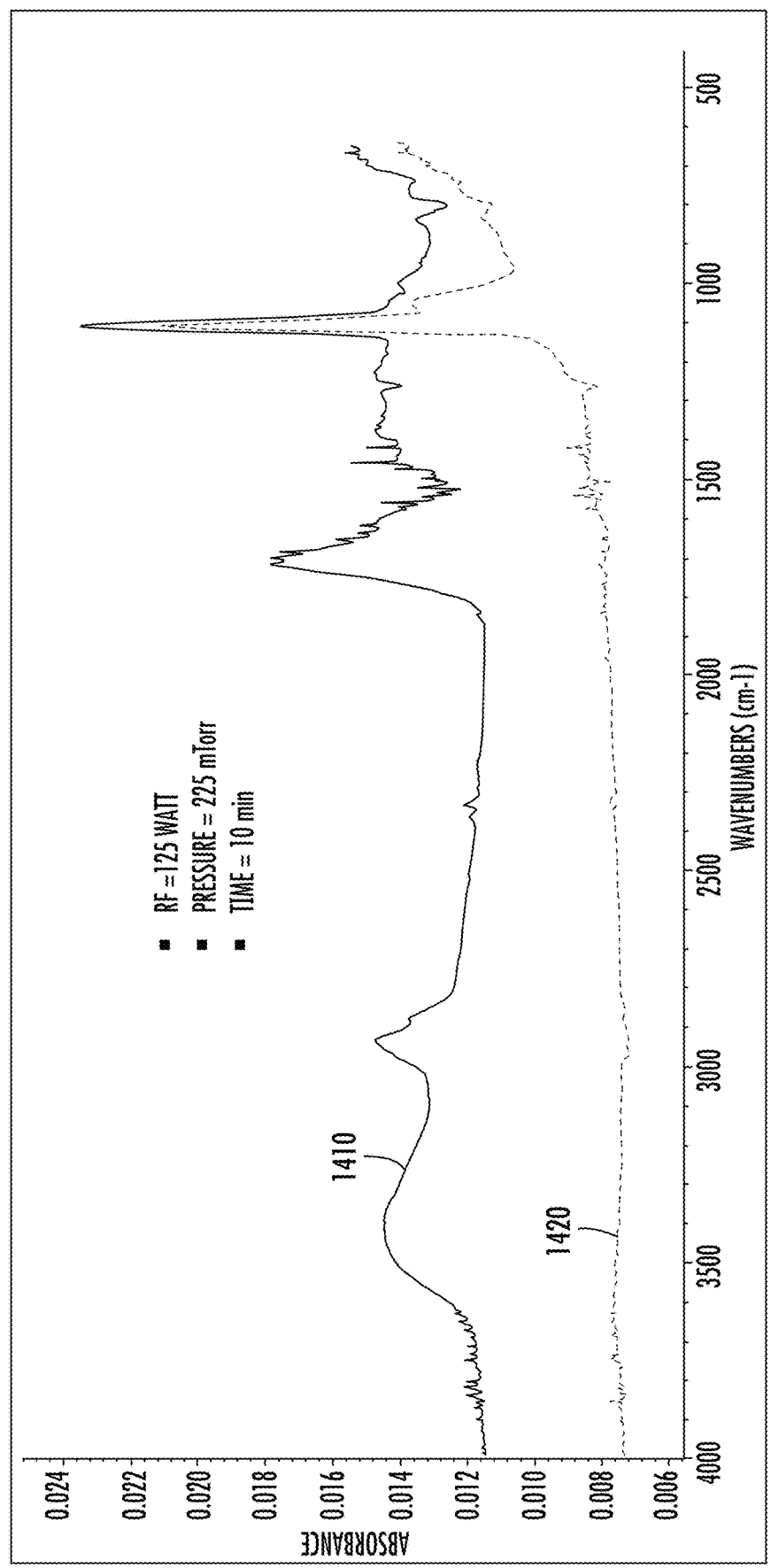

FIGS. 11-14 show FTIR results from this comparative example, which was obtained using a Thermo-Scientific Nicolet 6700 FTIR Spectrometer with a MCT/A Detector. FIG. 11 shows results from high power/high pressure test 14; FIG. 12 shows results from low power/low pressure test 17; FIG. 13 shows results from low power/high pressure test 15; and FIG. 14 shows results from high power/low pressure test 13. FTIR spectra 1110, 1210, 1310 and 1410 in FIGS. 11-14 show the data before etching, and FTIR spectra 1120, 1220, 1320 and 1420 show the results after etching.

In FIGS. 11-14, FTIR spectra 1120, 1220, 1320 and 1420 show that all of the conditions in Table 5 resulted in an effective removal of the AHM from the silicon wafer. In contrast, only some of the conditions using hydrogen peroxide in the above example resulted in an effective removal of the AHM. Enlargement of the Si—O—Si peak at about 1110 $cm^{-1}$ and the oxide of silicon structure at about 1040 $cm^{-1}$ can also be seen in some of the spectra in FIGS. 11-14

(e.g., in 1120 and 1420). The FTIR data suggests that the oxygen plasma is more aggressive than the hydrogen peroxide plasma, which could lead to more intensive oxidation of the silicon substrate, and damage due to increased ion bombardment. However, compositional changes in thin layers (e.g., less than 10 nm) of a surface (e.g., due to oxidation) cannot be directly detected using FTIR, since it is not a highly surface sensitive technique (the typical analysis depth for FTIR is about a micron).

Figure 15:
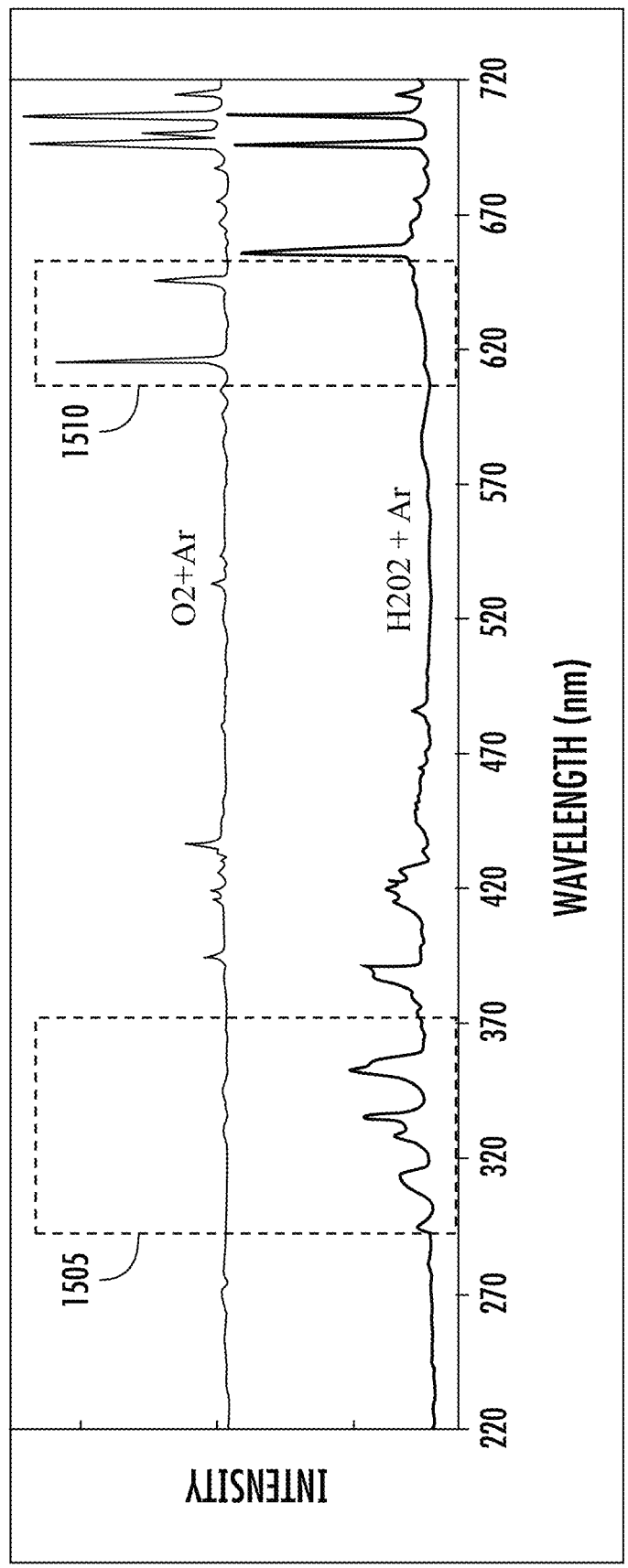
FIG. 15 shows spectra of the plasmas used in the examples herein, obtained using optical emission spectroscopy, in accordance with some embodiments.

FIG. 15 shows spectra of the plasmas used in the examples herein, obtained using optical emission spectroscopy. The experimentally obtained spectrum of the hydrogen peroxide plasma (i.e., "$H_2O_2$+Ar") includes peaks 1505. Not to be limited by theory, peaks 1505 may correspond to radicals derived from the hydrogen peroxide. The experimentally obtained spectrum of the oxygen plasma (i.e., "O2+Ar") includes peaks 1510 that were not observed in the spectrum from the hydrogen peroxide plasma (i.e., "H2O2+Ar"). Not to be limited by theory, the spectra in FIG. 15 appear to show that the oxygen plasma included an oxygen radical peak (e.g., in peaks 1510) that was not seen in the hydrogen peroxide plasma. Oxygen radicals could cause a surface or structure to be damaged or to oxidize during the AHM etching process. For example, oxygen radicals when attaching to the surface of silicon can not only penetrate the surface and create a relatively thick oxide layer, but can also convert two silicon atoms at the surface into a single bridged oxygen atom (to form $SiO_2$ and/or siloxane (i.e., Si=O)). The resulting $SiO_2$ and/or siloxane surface properties can be affected (e.g., they can be made less hydrophilic by the removal of surface hydroxyls and conversion to a single oxygen atom).

The example and the comparative examples show that hydrogen peroxide plasma can be as effective at removing an AHM as an oxygen plasma, and using a hydrogen peroxide plasma can be advantageous, since it can be less damaging to underlying and/or adjacent films and/or structures. The aggressiveness of the oxygen plasma can make it harder to control than the hydrogen peroxide plasma, and conversely, the AHM etching processes using hydrogen peroxide plasma can be more easily tunable (or more easily optimized). For example, the conditions that are effective at removing an AHM with as gentle conditions as possible to minimize the amount of damage done to underlying layers and surrounding structures can be more easily determined using a hydrogen peroxide plasma than an oxygen plasma. The less aggressive etching of the hydrogen peroxide plasma may also provide a wider process window, wherein, for example, an AHM is substantially removed from a substrate and there is no substantial oxidation (or damage) to other layers and/or structures on the substrate.

Methods

Figure 16:
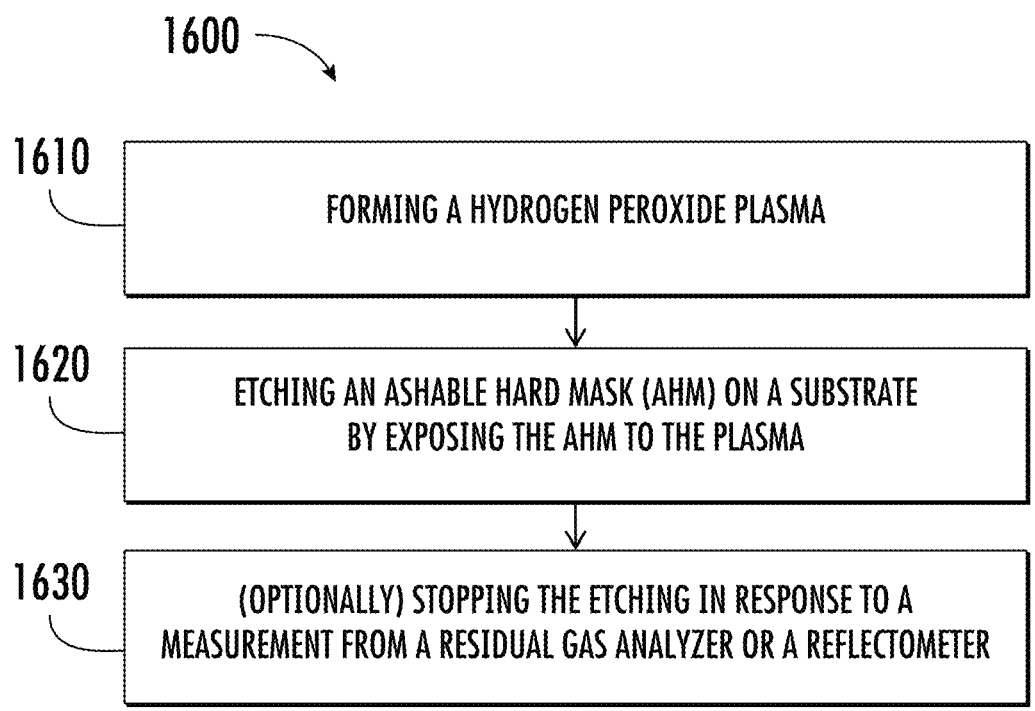
FIG. 16 is a flowchart of a method for etching an AHM on a substrate using a hydrogen peroxide plasma, in accordance with some embodiments.
Figure 17:
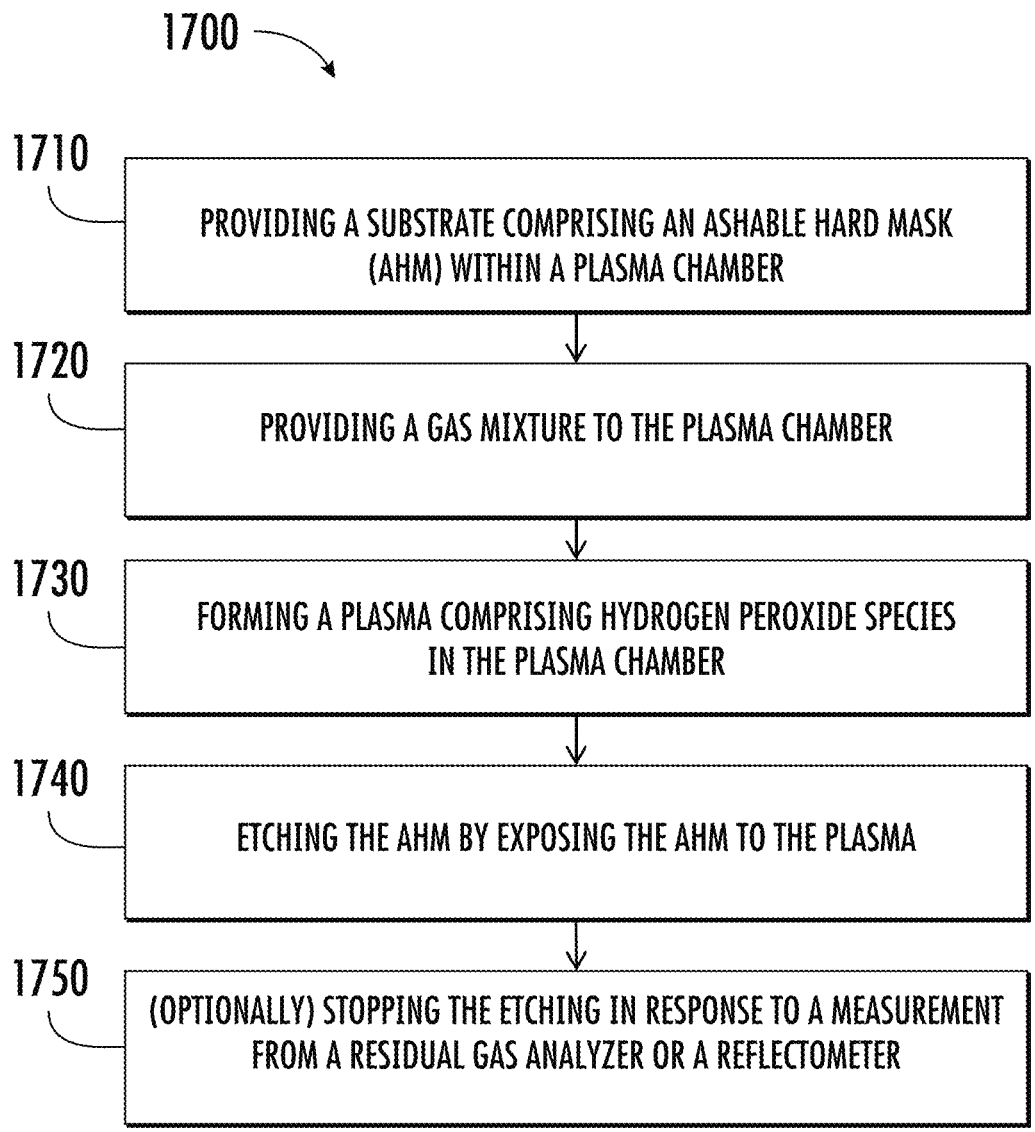
FIG. 17 is a flowchart of a method for etching an AHM on a substrate using a hydrogen peroxide plasma, in accordance with some embodiments.

FIGS. 16 and 17 are flowcharts of methods 1600 and 1700 for etching an AHM on a substrate using a hydrogen peroxide plasma. Methods 1600 and 1700 can be performed using system 100 of FIG. 1, or a similar system. System 100 can further include a control system (not shown in FIG. 1) including a processor and a tangible, computer-readable media (e.g., a local memory storage device, or on a server in the cloud) to control the system 100 to perform the methods described herein, for example, methods 1600 and 1700.

FIG. 16 is a flowchart of method 1600 for etching an AHM on a substrate using a hydrogen peroxide plasma, in accordance with some embodiments. In block 1610, a hydrogen peroxide plasma is formed. For example, a gas mixture of a hydrogen peroxide vapor and a carrier gas can be added to a plasma chamber, or a vacuum can be used to directly draw hydrogen peroxide vapor into the plasma chamber. In some cases, the hydrogen peroxide plasma may be formed in a remote plasma source, and the hydrogen peroxide plasma can then be introduced into the chamber. When a carrier gas is used, it can be different species such as noble gases (e.g., argon, helium, etc.), nitrogen, CDA, or hydrogen. In some cases, method 1600 can further include a block wherein an inert gas plasma is formed, and then hydrogen peroxide vapor is added to the inert gas plasma to form the hydrogen peroxide plasma. The inert gas plasma can be formed in the plasma chamber or remotely from the chamber.

A concentration of hydrogen peroxide vapor in the gas mixture used to form the plasma in block 1610 can be greater than 0.1% by volume, or greater than 1% by volume, or greater than 2.5% by volume, or greater than 10% by volume, or from 0.1% to 10% by volume, or from 0.1% to 2.5% by volume, or from 1% to 10% by volume, or from 1% to 2.5% by volume, or from 2.5% to 10% by volume, or from 1% to greater than 10% by volume. The mixture of the hydrogen peroxide vapor and the carrier gas can comprise less than 10% water by weight, or less than 1% oxygen by weight (or can include any of the hydrogen peroxide materials compositions described herein). In some cases, a molar ratio of hydrogen peroxide to water is greater than one, or a molar ratio of hydrogen peroxide to oxygen is greater than one in the gas mixture. The hydrogen peroxide can be anhydrous, in some cases. The gas mixture input into the plasma chamber (e.g., a mixture of the hydrogen peroxide vapor and the carrier gas) can be substantially free of oxygen, in some cases. However, some water and/or oxygen may be present in the resulting plasma due to decomposition of hydrogen peroxide into water and oxygen within the plasma. In some cases, the gas mixture has no intentionally introduced sulfur or halogen-containing species. In some cases, the gas mixture has a concentration of sulfur species less than 0.01% by volume. In some cases, the gas mixture has a concentration of halogen-containing species less than 0.01% by volume.

In block 1620, an AHM on a substrate is etched by exposing the AHM to the hydrogen peroxide plasma. The substrate can be a semiconductor wafer, for example, silicon, or other type of material. The plasma conditions, such as RF power and pressure, and the exposure time for the etching can be chosen to substantially remove the AHM in 10 minutes or less. Optionally, substrate (or sample) temperature can also be controlled during the etching. The parameters can be tuned to control the AHM etch rate, and aggressiveness of the plasma (e.g., to limit the oxidization or damage to other layers and/or structures on the substrate). In some cases, the plasma conditions and exposure time can be chosen to substantially remove the AHM from the substrate and not substantially oxidize the substrate during the etching. In some cases, the substrate will further have one or more layers and/or structures disposed upon it either adjacent to or underneath the AHM, and the plasma conditions and exposure time can also be chosen to not substantially oxidize those layers and/or structures during the etching. In some cases, an amount of RF power used during the etching is higher than a minimum amount of RF power that would be required to remove the AHM using an oxygen plasma. In some cases, the etching is done at room temperature, and in other cases the temperature can be controlled or uncontrolled in the range from 25° C. to 450° C.

In optional block 1630, the etching is stopped in response to a measurement from a residual gas analyzer or a reflectometer. For example, the residual gas analyzer can be configured to monitor species in the plasma chamber, and can be used to determine when a layer has been substantially etched by detecting a change in the etch byproducts in the plasma species within the plasma chamber. In another example, the reflectometer can measure an optical property of the surface of the sample (e.g., a magnitude of reflectivity at a certain wavelength or over a certain wavelength range, or a spectrum of the surface reflection can be analyzed) to determine the thickness of the AHM as it is being etched, or to detect when the AHM has been substantially removed.

FIG. 17 is a flowchart of method 1700 for etching an AHM on a substrate using a hydrogen peroxide plasma, in accordance with another embodiment.

In block 1710, a substrate with an AHM is provided within a plasma chamber. The substrate can be a semiconductor wafer, for example, silicon, or other type of material. In block 1720, a gas mixture is provided to the plasma chamber. The gas mixture can include hydrogen peroxide vapor and a carrier gas. The carrier gas can be many different species such as noble gases (e.g., argon, helium, etc.), nitrogen, CDA, or hydrogen. In other cases, vacuum can be used to directly draw the hydrogen peroxide vapor into the plasma chamber, and in such cases, no carrier gas would be added to the gas mixture. A concentration of hydrogen peroxide vapor in the gas mixture can be greater than 0.1% by volume, or greater than 1% by volume, or greater than 2.5% by volume, or greater than 10% by volume, or from 0.1% to 10% by volume, or from 0.1% to 2.5% by volume, or from 1% to 10% by volume, or from 1% to 2.5% by volume, or from 2.5% to 10% by volume, or from 1% to greater than 10% by volume. In some cases, a molar ratio of hydrogen peroxide to water is greater than one, or a molar ratio of hydrogen peroxide to oxygen is greater than one in the gas mixture. The mixture of the hydrogen peroxide vapor and the carrier gas can comprise less than 10% water by weight, and/or less than 1% oxygen by volume (or can include any of the hydrogen peroxide materials compositions described herein). The hydrogen peroxide can be anhydrous, as described herein, in some cases. The mixture of the hydrogen peroxide vapor and the carrier gas can be substantially free of oxygen, in some cases. However, some water and/or oxygen may be present in the resulting plasma due to decomposition of hydrogen peroxide into water and oxygen within the plasma. In some cases, the gas mixture has no intentionally introduced sulfur or halogen-containing species. In some cases, the gas mixture has a concentration of sulfur species less than 0.01% by volume. In some cases, the gas mixture has a concentration of halogen-containing species less than 0.01% by volume.

In block 1730, a hydrogen peroxide plasma comprising hydrogen peroxide species is formed in the plasma chamber from the gas mixture. In some cases, the hydrogen peroxide plasma may be formed in a remote plasma source, and the hydrogen peroxide plasma can then be introduced into the chamber. In some cases, method 1700 can further include a block wherein an inert gas plasma is formed, and then hydrogen peroxide vapor is added to the inert gas plasma to form the hydrogen peroxide plasma. The inert gas plasma can be formed in the plasma chamber or remotely from the chamber.

In block 1740, an AHM on a substrate is etched by exposing the AHM to the hydrogen peroxide plasma. The plasma conditions, such as RF power and pressure, and the exposure time for the etching can be chosen to substantially remove the AHM in 10 minutes or less. The plasma conditions and exposure time can also be chosen to substantially remove the AHM from the substrate and not substantially oxidize the substrate during the etching. In some cases, the substrate will further have one or more layers and/or structures disposed upon it either adjacent to or underneath the AHM, and the plasma conditions and exposure time can also be chosen to not substantially oxidize those layers and/or structures during the etching. In some cases, an amount of RF power used during the etching is higher than a minimum amount of RF power that would be required to remove the AHM using an oxygen plasma. In some cases, the etching is done at room temperature, and in other cases the temperature can be controlled or uncontrolled in the range from 25° C. to 450° C.

In some cases of methods 1600 and 1700, the substrate further comprises a layered structure comprising one or more thin films underneath or adjacent to the AHM. In some cases, due to the relatively gentle and controllable AHM etching rates possible using hydrogen peroxide plasmas, the layered structure can be unaltered, or substantially unaltered (e.g., not substantially oxidized), during the etching. Therefore, the hydrogen peroxide AHM etching methods and systems described herein can be particularly advantageous for removing AHMs from substrates with sensitive layers and/or structures disposed thereupon.

In some cases of methods 1600 and 1700 (in blocks 1610, 1620, 1730 and 1740), the plasma is formed using an RF power and a pressure, the AHM is exposed to the plasma for an exposure time, and the method further comprises controlling the RF power, the pressure, and the exposure time to substantially remove the AHM without substantially oxidizing the substrate, or a layer or structure on the substrate, during the etching. In some cases, a minimum amount of RF power used during the etching is higher than a minimum amount of RF power that would be required to remove the AHM using an oxygen plasma under equivalent pressure, time and temperature conditions.

Embodiments

Clause 1. A method, comprising: forming a plasma from a gas mixture, wherein: the gas mixture comprises hydrogen peroxide vapor with a concentration greater than 0.1% by volume; the concentration of the hydrogen peroxide vapor in the gas mixture is substantially stable over time; and the plasma comprises hydrogen peroxide species; and etching an ashable hard mask (AHM) on a substrate by exposing the AHM to the plasma.

Clause 2. The method of clause 1, wherein the gas mixture further comprises a molar ratio of water to hydrogen peroxide that is substantially stable over time.

Clause 3. The method of clause 1, wherein the gas mixture further comprises a carrier gas, and wherein the concentration of the hydrogen peroxide vapor is greater than 2.5%.

Clause 4. The method of clause 3, wherein the carrier gas comprises $N_2$, hydrogen, helium, Ar, compressed dry air (CDA), or mixtures thereof.

Clause 5. The method of clause 1, wherein the gas mixture further comprises a concentration of water less than 1% by weight, and wherein a molar ratio of water to hydrogen peroxide in the gas mixture is substantially stable over time.

Clause 6. The method of clause 1, wherein the gas mixture comprises a concentration of sulfur species less than 0.1% by volume.

Clause 7. The method of clause 1, wherein the gas mixture comprises a concentration of halogen-containing species less than 0.1% by volume.

Clause 8. The method of clause 1, wherein the substrate is a semiconductor wafer, or a silicon wafer.

Clause 9. The method of clause 1, wherein the substrate is at ambient temperature during the etching, or a temperature of the substrate is between 25° C. and 450° C. during the etching.

Clause 10. The method of clause 1, further comprising monitoring etched species during the etching using a residual gas analyzer, and wherein the etching is stopped in response to a measurement from the residual gas analyzer.

Clause 11. The method of clause 1, further comprising monitoring etched species during the etching using a reflectometer, and wherein the etching is stopped in response to a measurement from the reflectometer.

Clause 12. The method of clause 1, wherein the AHM is substantially removed in less than 10 minutes of plasma exposure.

Clause 13. The method of clause 1, wherein the substrate is not substantially oxidized during the etching, or a layer or structure on the substrate is not substantially oxidized during the etching.

Clause 14. The method of clause 1, wherein: the plasma is formed using an RF power and a pressure; the AHM is exposed to the plasma for an exposure time; and the method further comprises controlling the RF power, the pressure, and the exposure time to substantially remove the AHM without substantially oxidizing the substrate during the etching, or without substantially oxidizing a layer or structure on the substrate during the etching.

Clause 15. The method of clause 1, wherein a minimum amount of RF power used during the etching is higher than a minimum amount of RF power that would be required to remove the AHM using an oxygen plasma under equivalent pressure, time and temperature conditions.

Clause 16. A method, comprising: providing a substrate comprising an ashable hard mask (AHM) within a plasma chamber; providing a gas mixture to the plasma chamber comprising hydrogen peroxide vapor with a concentration greater than 0.1% by volume, wherein the concentration of the hydrogen peroxide vapor in the gas mixture is substantially stable over time; forming a plasma comprising hydrogen peroxide species in the plasma chamber; and etching the AHM by exposing the AHM to the plasma.

Clause 17. The method of clause 16, wherein the gas mixture further comprises a molar ratio of water to hydrogen peroxide that is substantially stable over time.

Clause 18. The method of clause 16, wherein the gas mixture further comprises a carrier gas, and wherein the concentration of the hydrogen peroxide vapor is greater than 2.5%.

Clause 19. The method of clause 16, wherein the gas mixture further comprises a concentration of water less than 1% by weight, and wherein a molar ratio of water to hydrogen peroxide in the gas mixture is substantially stable over time.

Clause 20. The method of clause 16, wherein: the plasma is formed using an RF power and a pressure; the AHM is exposed to the plasma for an exposure time; and the method further comprises controlling the RF power, the pressure, and the exposure time to substantially remove the AHM without substantially oxidizing the substrate during the etching, or without substantially oxidizing a layer or structure on the substrate during the etching.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

Although the invention has been described with reference to the above example, it will be understood that modifications and variations are encompassed within the scope of the invention. Accordingly, the invention is limited only by the following claims.

What is claimed is:

1. A method, comprising:
    forming a plasma from a gas mixture, wherein:
        the gas mixture comprises hydrogen peroxide vapor with a concentration greater than 0.1% by volume;
        the concentration of the hydrogen peroxide vapor in the gas mixture is substantially stable over time; and
        the plasma comprises hydrogen peroxide species; and
    etching an ashable hard mask (AHM) on a substrate by exposing the AHM to the plasma.

2. The method of claim 1, wherein the gas mixture further comprises a molar ratio of water to hydrogen peroxide that is substantially stable over time.

3. The method of claim 1, wherein the gas mixture further comprises a carrier gas, and wherein the concentration of the hydrogen peroxide vapor is greater than 2.5%.

4. The method of claim 3, wherein the carrier gas comprises $N_2$, hydrogen, helium, Ar, compressed dry air (CDA), or mixtures thereof.

5. The method of claim 1, wherein the gas mixture further comprises a concentration of water less than 1% by weight, and wherein a molar ratio of water to hydrogen peroxide in the gas mixture is substantially stable over time.

6. The method of claim 1, wherein the gas mixture comprises a concentration of sulfur species less than 0.1% by volume.

7. The method of claim 1, wherein the gas mixture comprises a concentration of halogen-containing species less than 0.1% by volume.

8. The method of claim 1, wherein the substrate is a semiconductor wafer, or a silicon wafer.

9. The method of claim 1, wherein the substrate is at ambient temperature during the etching, or a temperature of the substrate is between 25° C. and 450° C. during the etching.

10. The method of claim 1, further comprising monitoring etched species during the etching using a residual gas analyzer, and wherein the etching is stopped in response to a measurement from the residual gas analyzer.

11. The method of claim 1, further comprising monitoring etched species during the etching using a reflectometer, and wherein the etching is stopped in response to a measurement from the reflectometer.

12. The method of claim 1, wherein the AHM is substantially removed in less than 10 minutes of plasma exposure.

13. The method of claim 1, wherein the substrate is not substantially oxidized during the etching, or a layer or structure on the substrate is not substantially oxidized during the etching.

14. The method of claim 1, wherein:
the plasma is formed using an RF power and a pressure;
the AHM is exposed to the plasma for an exposure time; and
the method further comprises controlling the RF power, the pressure, and the exposure time to substantially remove the AHM without substantially oxidizing the substrate during the etching, or without substantially oxidizing a layer or structure on the substrate during the etching.

15. The method of claim 1, wherein a minimum amount of RF power used during the etching is higher than a minimum amount of RF power that would be required to remove the AHM using an oxygen plasma under equivalent pressure, time and temperature conditions.

16. A method, comprising:
providing a substrate comprising an ashable hard mask (AHM) within a plasma chamber;
providing a gas mixture to the plasma chamber comprising hydrogen peroxide vapor with a concentration greater than 0.1% by volume, wherein the concentration of the hydrogen peroxide vapor in the gas mixture is substantially stable over time;
forming a plasma comprising hydrogen peroxide species in the plasma chamber; and
etching the AHM by exposing the AHM to the plasma.

17. The method of claim 16, wherein the gas mixture further comprises a molar ratio of water to hydrogen peroxide that is substantially stable over time.

18. The method of claim 16, wherein the gas mixture further comprises a carrier gas, and wherein the concentration of the hydrogen peroxide vapor is greater than 2.5%.

19. The method of claim 16, wherein the gas mixture further comprises a concentration of water less than 1% by weight, and wherein a molar ratio of water to hydrogen peroxide in the gas mixture is substantially stable over time.

20. The method of claim 16, wherein:
the plasma is formed using an RF power and a pressure;
the AHM is exposed to the plasma for an exposure time; and
the method further comprises controlling the RF power, the pressure, and the exposure time to substantially remove the AHM without substantially oxidizing the substrate during the etching, or without substantially oxidizing a layer or structure on the substrate during the etching.

* * * * *

UNITED STATES PATENT AND TRADEMARK OFFICE
CERTIFICATE OF CORRECTION

| | |
|---|---|
| PATENT NO. | : 12,057,320 B2 |
| APPLICATION NO. | : 18/472551 |
| DATED | : August 6, 2024 |
| INVENTOR(S) | : Jeffrey J. Spiegelman |

It is certified that error appears in the above-identified patent and that said Letters Patent is hereby corrected as shown below:

On the Title Page

Item (73) Assignee, please delete "RASIRO, Inc." and insert --RASIRC, Inc.--

Signed and Sealed this
Eighth Day of October, 2024

Katherine Kelly Vidal
*Director of the United States Patent and Trademark Office*